(12) United States Patent
Chang et al.

(10) Patent No.: US 12,356,630 B2
(45) Date of Patent: Jul. 8, 2025

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventors: Fu-Chen Chang, New Taipei (TW); Kuo-Chi Tu, Hsinchu (TW); Tzu-Yu Chen, Kaohsiung (TW); Sheng-Hung Shih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 18/501,360

(22) Filed: Nov. 3, 2023

(65) Prior Publication Data
US 2024/0074206 A1   Feb. 29, 2024

Related U.S. Application Data

(60) Continuation of application No. 17/712,543, filed on Apr. 4, 2022, now Pat. No. 11,849,588, which is a division of application No. 16/727,673, filed on Dec. 26, 2019, now Pat. No. 11,296,116.

(51) Int. Cl.
| | |
|---|---|
| *H10B 51/30* | (2023.01) |
| *G11C 11/22* | (2006.01) |
| *H01L 49/02* | (2006.01) |
| *H10B 51/10* | (2023.01) |
| *H10B 53/00* | (2023.01) |
| *H10B 53/30* | (2023.01) |

(52) U.S. Cl.
CPC ............ *H10B 51/30* (2023.02); *G11C 11/223* (2013.01); *H01L 28/57* (2013.01); *H01L 28/60* (2013.01); *H10B 51/10* (2023.02); *H10B 53/00* (2023.02); *H10B 53/30* (2023.02)

(58) Field of Classification Search
CPC ........ H10B 51/30; H10B 51/10; H10B 53/00; H10B 53/30; G11C 11/223; G11C 11/221; H01L 28/57; H01L 28/60; H01L 28/90
See application file for complete search history.

(56) References Cited

U.S. PATENT DOCUMENTS

| | | | | |
|---|---|---|---|---|
| 2002/0153550 A1* | 10/2002 | An | ........................ | H01L 28/65 257/296 |
| 2002/0192902 A1* | 12/2002 | Kimura | ................. | H10B 12/50 257/E21.018 |
| 2004/0129961 A1* | 7/2004 | Paz de Araujo | ....... | H10B 53/00 257/295 |

(Continued)

*Primary Examiner* — S M Sohel Imtiaz
(74) *Attorney, Agent, or Firm* — Maschoff Brennan

(57) ABSTRACT

A semiconductor device includes a random access memory (RAM) structure and a dielectric layer. The RAM structure is over a substrate and includes a bottom electrode layer, a ferroelectric layer over the bottom electrode layer, and a top electrode layer over the ferroelectric layer. The dielectric layer is over the substrate and laterally surrounds a lower portion of the RAM structure. From a cross-sectional view, the bottom electrode layer of the RAM structure has a lateral portion and a vertical portion, and the vertical portion upwardly extends from the lateral portion to a position higher than a top surface of the dielectric layer.

20 Claims, 30 Drawing Sheets

(56) References Cited

U.S. PATENT DOCUMENTS

| | | | |
|---|---|---|---|
| 2004/0195603 A1* | 10/2004 | Ito | H01L 28/75 |
| | | | 257/295 |
| 2005/0254310 A1* | 11/2005 | Lee | G11C 11/22 |
| | | | 365/65 |
| 2008/0048226 A1* | 2/2008 | Heo | H01L 28/57 |
| | | | 257/295 |
| 2010/0252916 A1* | 10/2010 | Chen | H01L 21/78 |
| | | | 257/E23.179 |
| 2013/0168813 A1* | 7/2013 | Sashida | H01L 21/76849 |
| | | | 257/532 |
| 2018/0342297 A1* | 11/2018 | Kim | G11C 11/56 |
| 2019/0181147 A1* | 6/2019 | Liu | H01L 29/78642 |
| 2020/0212055 A1* | 7/2020 | Lin | H10B 53/30 |
| 2020/0395460 A1* | 12/2020 | Haratipour | H01L 29/221 |

\* cited by examiner

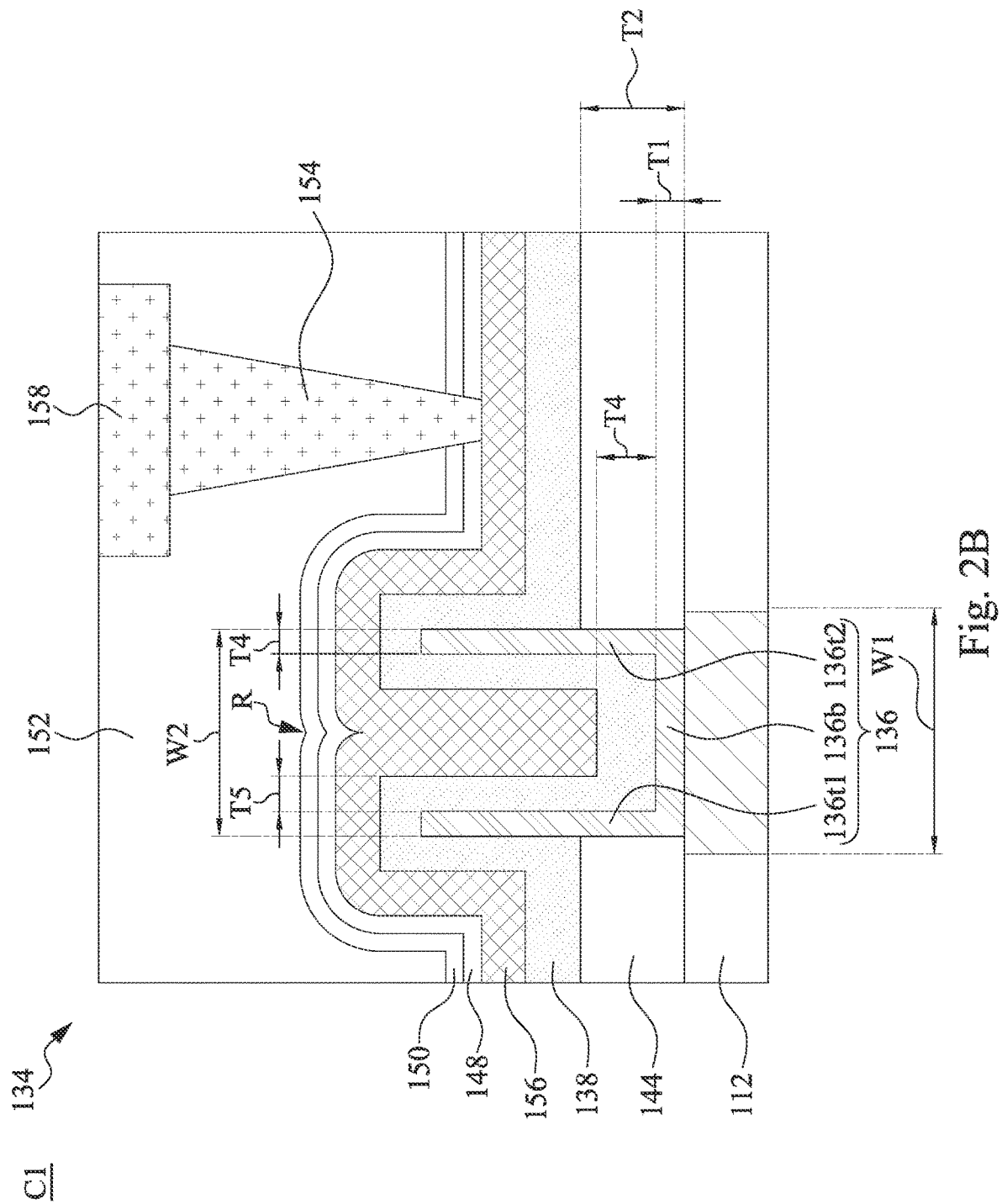

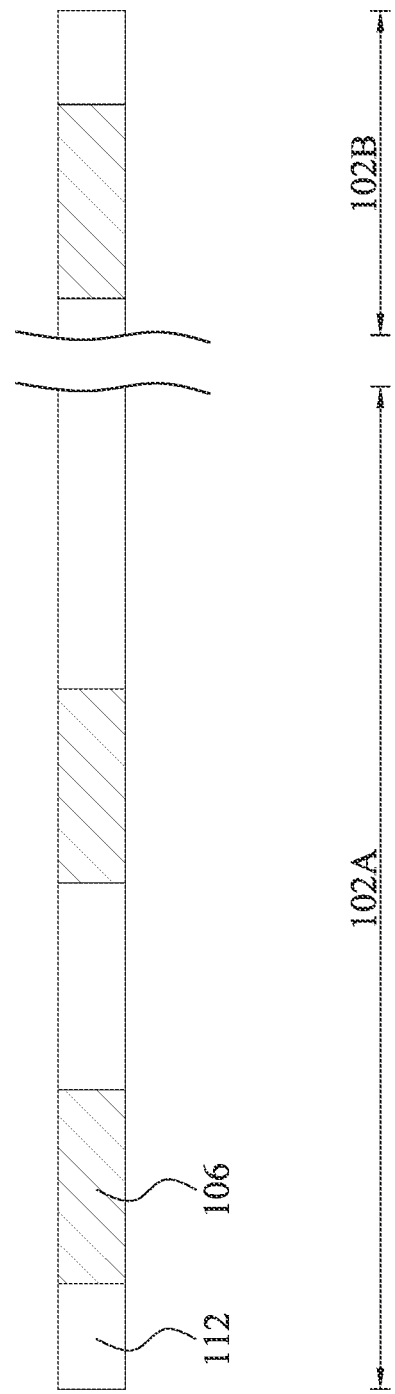

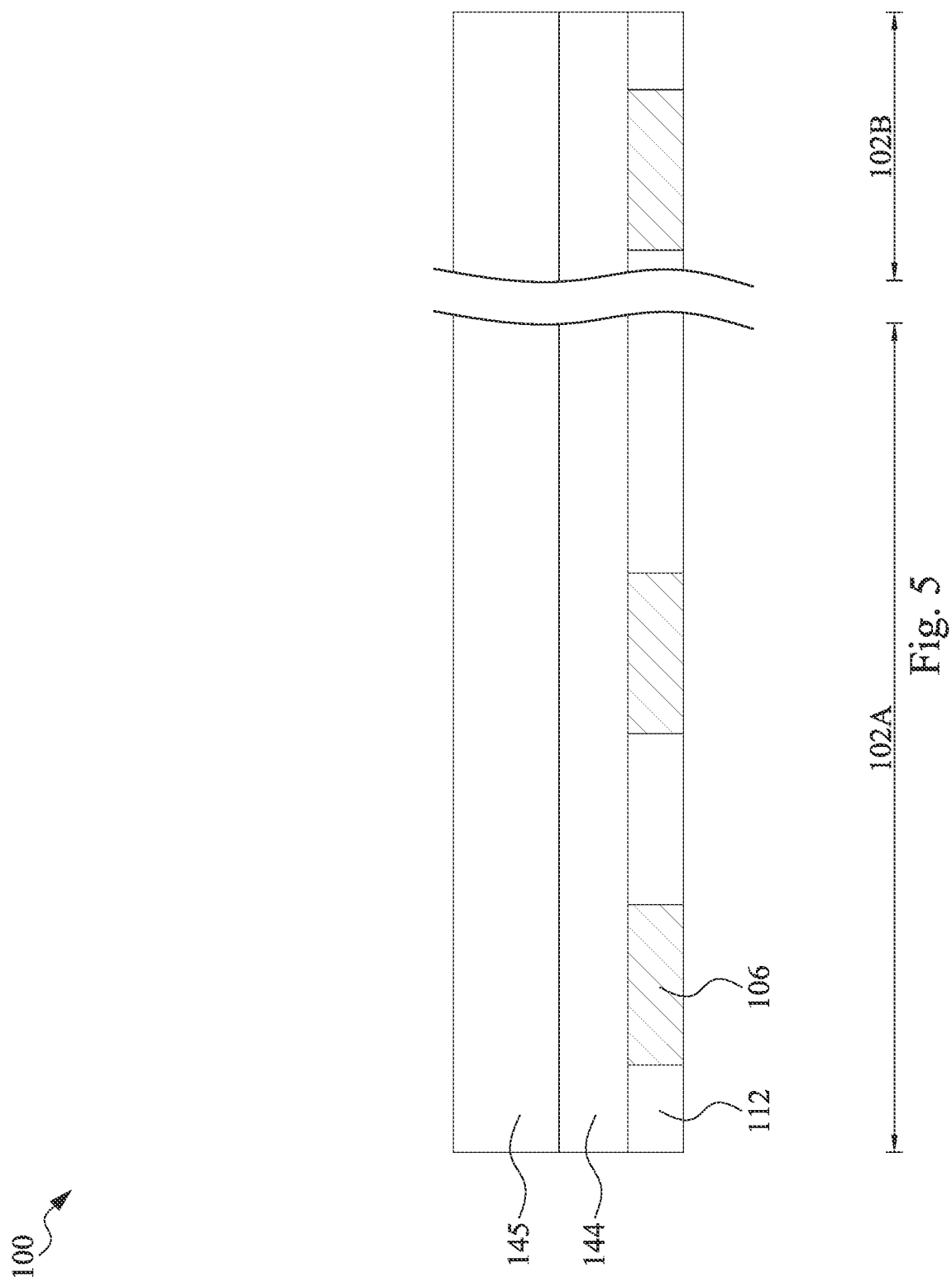

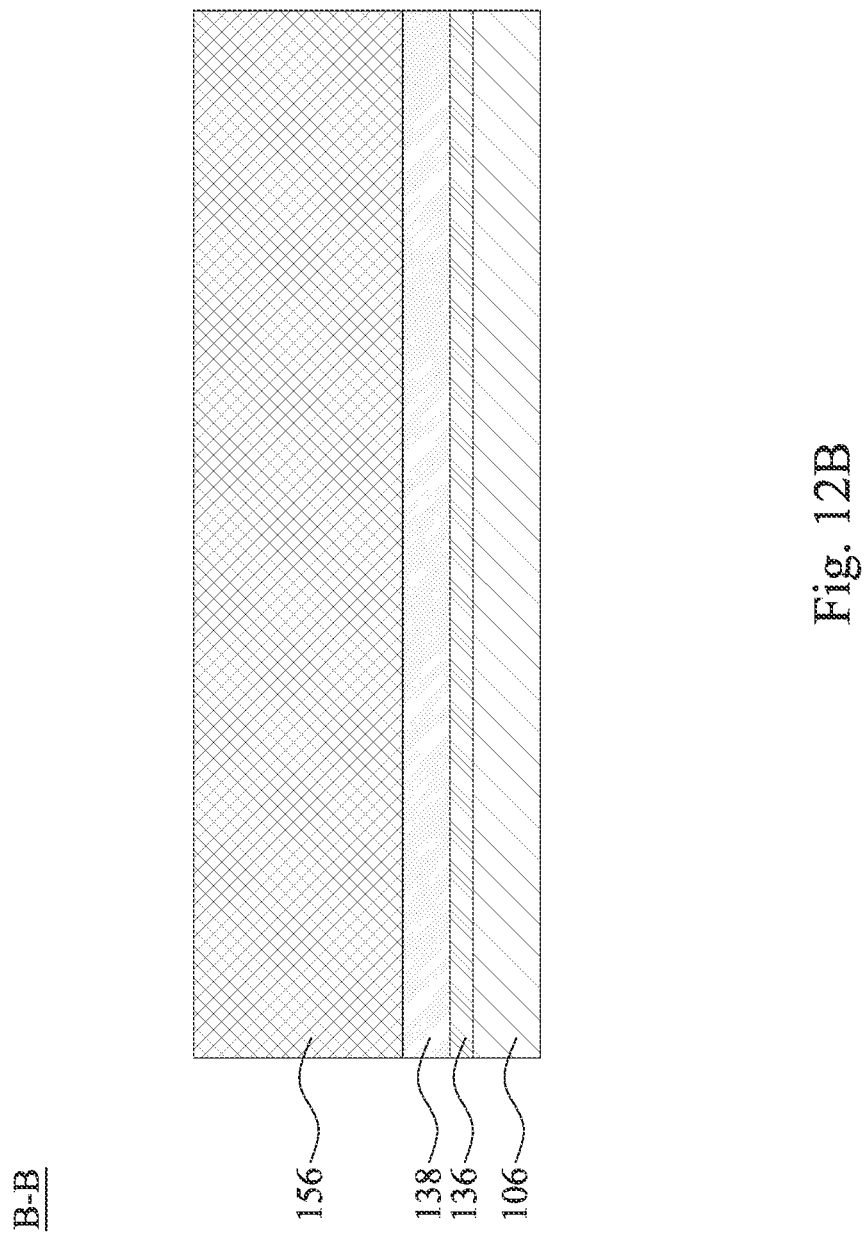

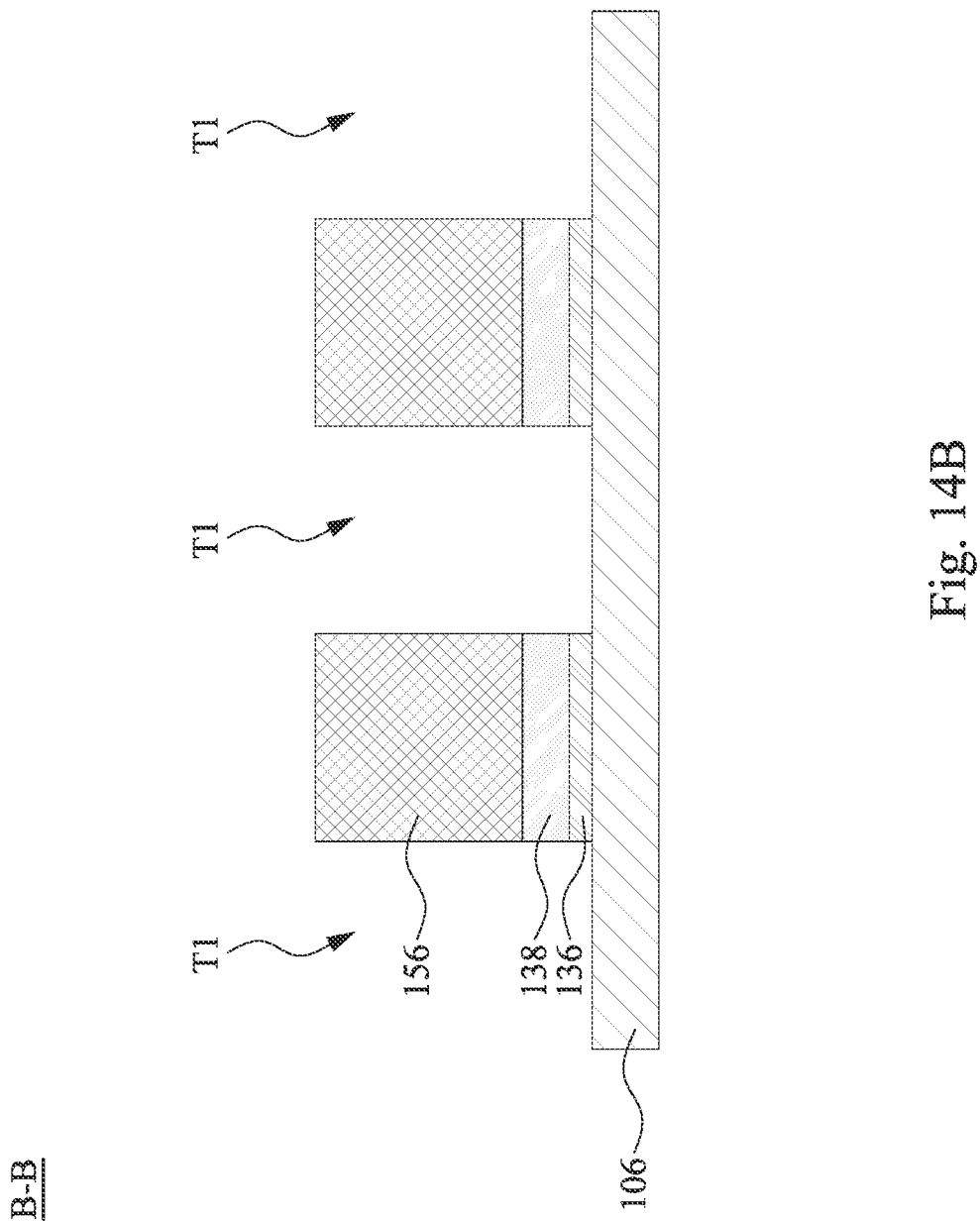

SEMICONDUCTOR DEVICE AND METHOD OF FORMING THE SAME

PRIORITY CLAIM AND CROSS-REFERENCE

The present application is a Continuation Application of U.S. application Ser. No. 17/712,543, filed Apr. 4, 2022, which is a Divisional Application of the U.S. application Ser. No. 16/727,673, filed Dec. 26, 2019, now U.S. Pat. No. 11,296,116, issued Apr. 5, 2022, which is herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a local enlarged view of the FRAM structure according to a region in FIG. 2A.

FIGS. 4, 5, 6, 7, 8, 9, 10, 11, 12A, 13A, 14A, 15, 16, 17, 18, and 19 are cross-sectional views of a method of forming a semiconductor device at various stages in accordance with various embodiments of the present disclosure.

FIG. 12B is a cross-sectional view taken along line B-B in FIG. 12A.

FIG. 14B is a cross-sectional view taken along line B-B in FIG. 14A.

DETAILED DESCRIPTION

Figure 1A:
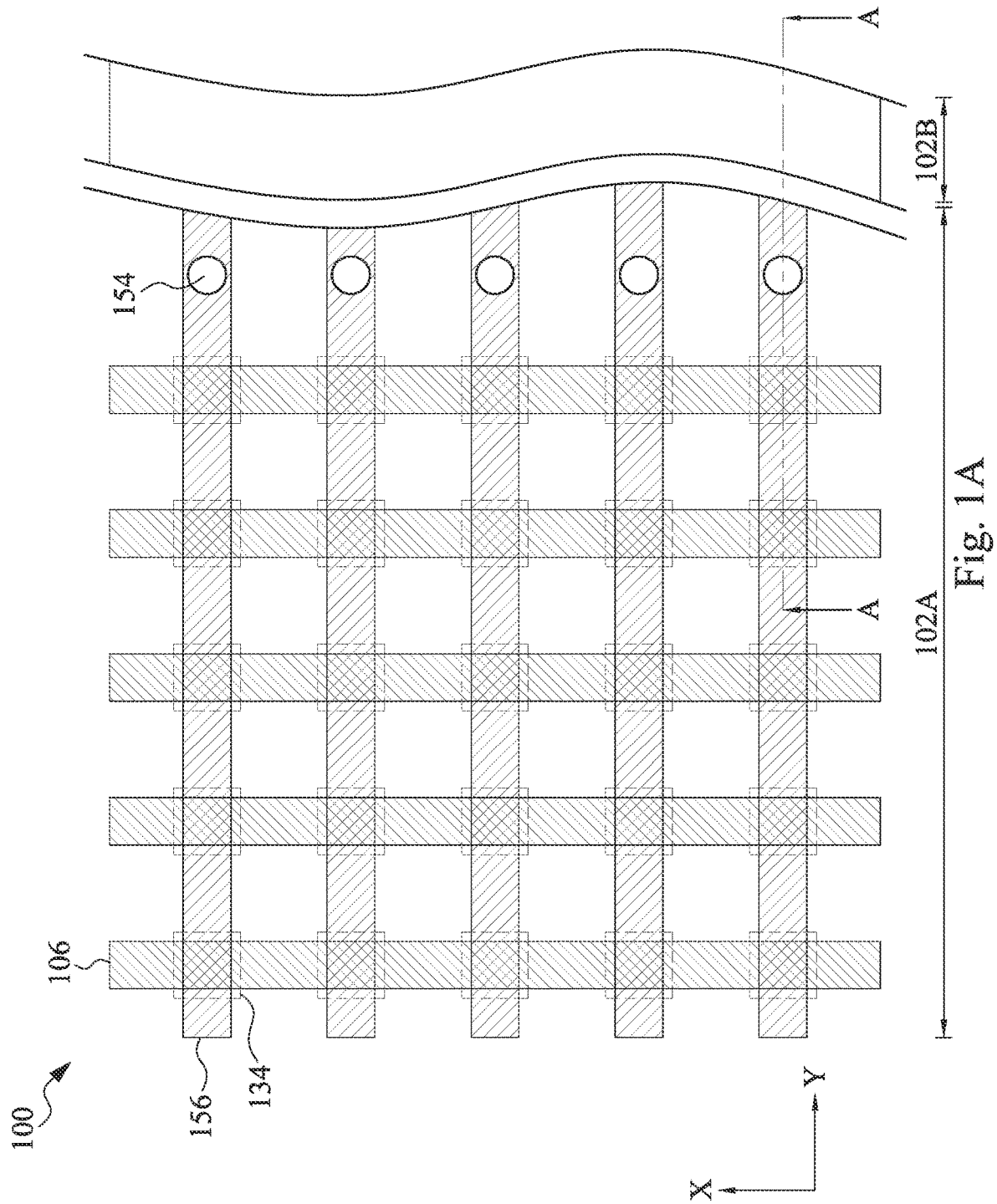
FIG. 1A is a top view of an integrated circuit (IC) structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
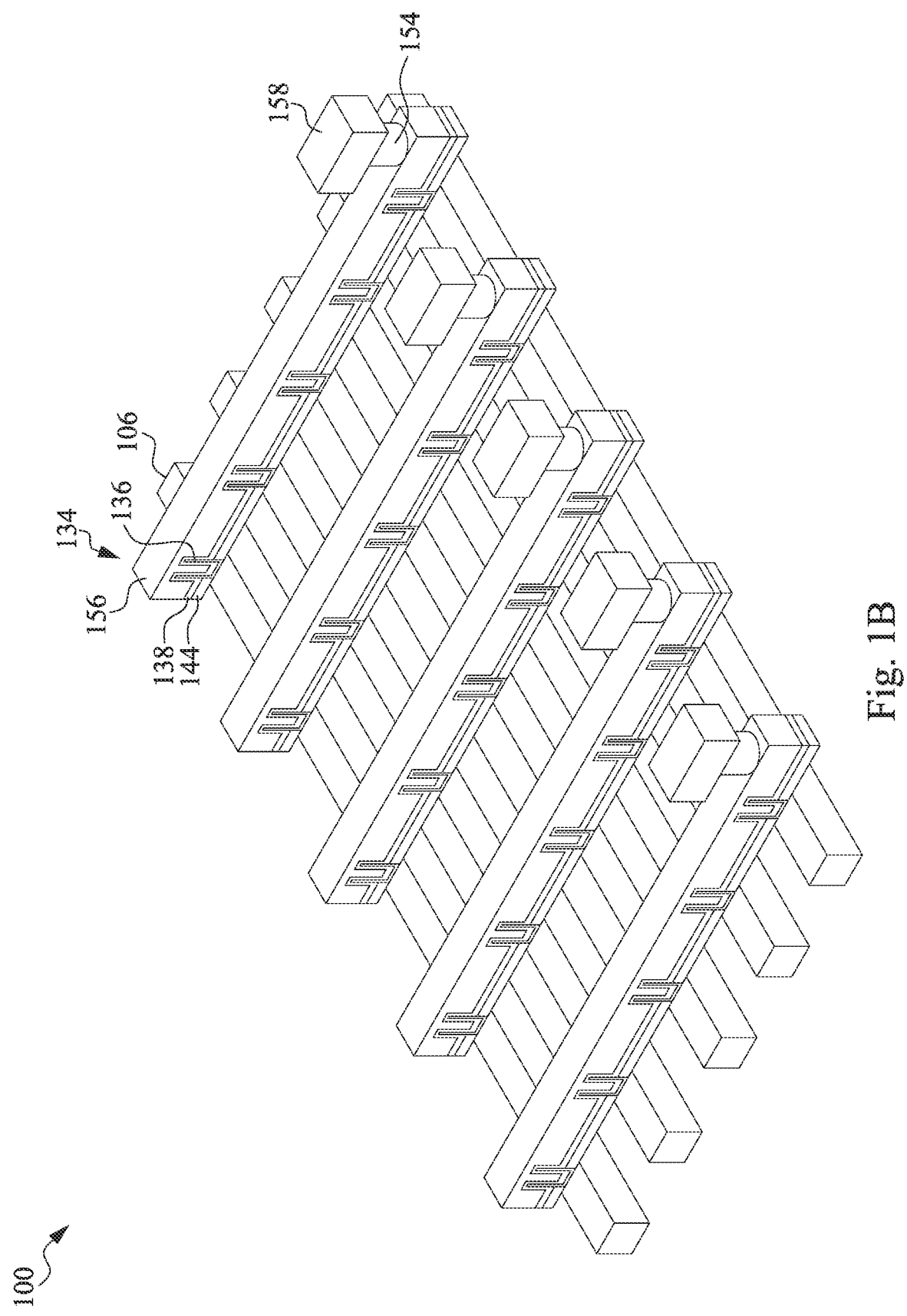
FIG. 1B is a perspective view of a ferroelectric random access memory (FRAM) cell in the IC structure of FIG. 1A.

Reference is made to FIGS. 1A and 1B. FIG. 1A is a top view of an integrated circuit (IC) structure 100 according to some embodiments of the present disclosure. FIG. 1B is a perspective view of a ferroelectric random access memory (FRAM) cell in the IC structure 100 of FIG. 1A. The FRAM cell is a semiconductor memory that is used for the ferroelectric film (Film Ferroelectric) in a part of the memory cell, the memory cell of the ferroelectric film by the polarization state data ("0", "1") is determined. That FRAM comprises high-speed operation and reduced power consumption, increased memory capacity, and with the non-volatile is cut off, the power data will not be erased to allow the number of rewrites (write/erase cycles).

In FIGS. 1A and 1B, the integrated circuit 100 includes a logic region 102B and a memory region 102A. The logic region 102B may include circuitry, such as an exemplary logic transistor. The memory region 102A can correspond to an array of memory cells 134 (which may be also referred to as ferroelectric random access memory (FRAM) structures) while the logic device portion 102B can couple logic devices, such as transistors formed in a substrate underlying thereof, to support operation of the memory cells 134. Specifically, the circuitry of the logic region 102B is for processing information received from memory cells 134 in the memory region 102A and for controlling reading and writing functions of the memory cells 134.

In FIGS. 1A and 1B, the memory cell 134 may include a bottom electrode layer 136 and a top electrode layer 156, with a ferroelectric layer 138 sandwiched in between the bottom and top electrode layers 136 and 156. The bottom electrode 136 is embedded in a dielectric layer 144. The memory cell 134 is built over a bottom conductive line 106. In some embodiments, a plurality of the memory cells 134 are built over one of the bottom conductive lines 106. The bottom conductive line 106 extends along a first direction (e.g., X-direction). The top electrode layer extends along a second direction (e.g., Y-direction) that is substantially perpendicular to the first direction. In some embodiments, the top electrode layer 156, the ferroelectric layer 138, and the bottom electrode layer 136 have substantially the same width when viewed in a cross section taken along the first direction. The top electrode via (TEVA) 154 and the conductive line 158 may land on a periphery of cell line and non-overlaps the memory cell 134, such that the top electrode via 154 may not align the memory cell 134 so as to improve the process window.

Figure 2A:
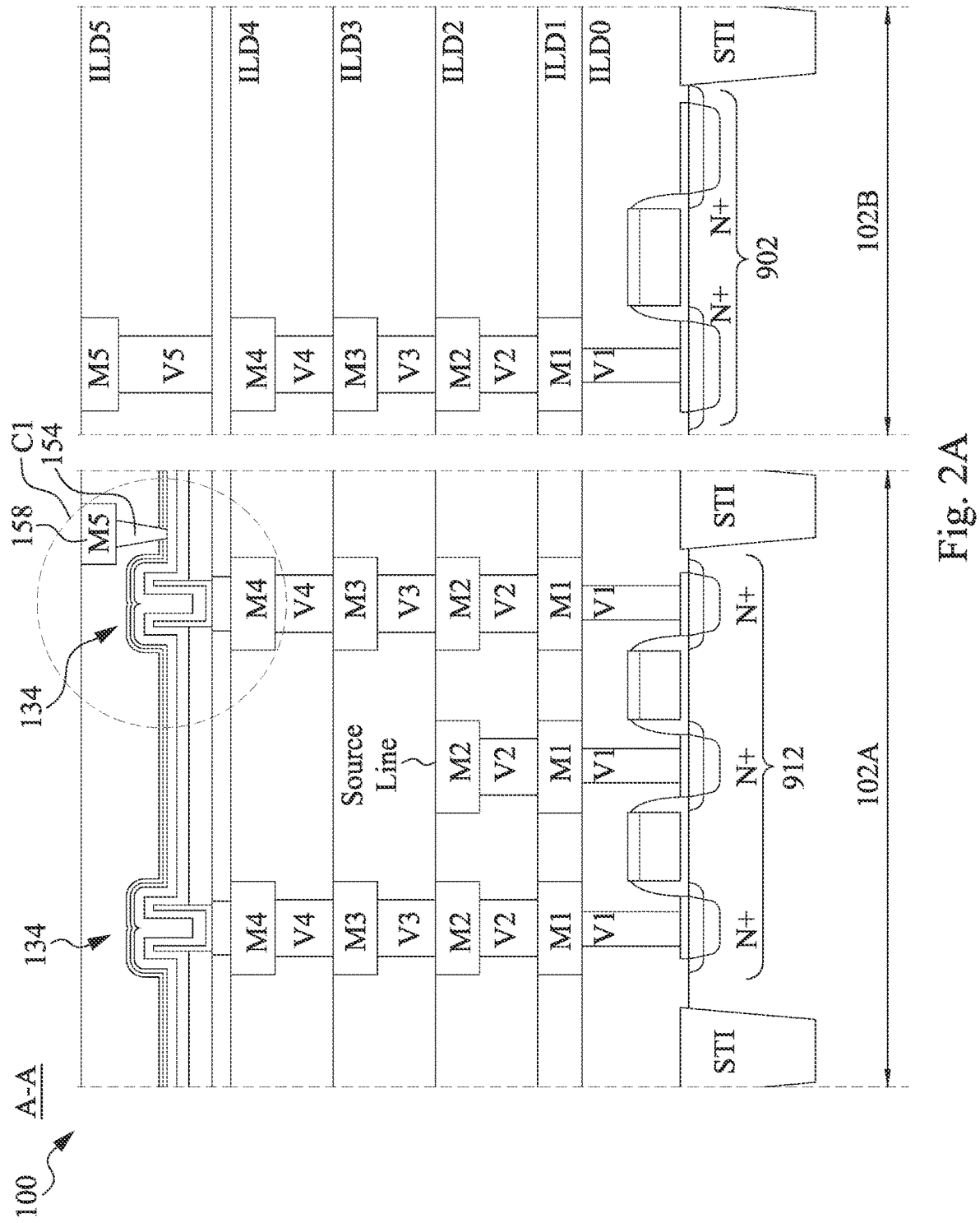
FIG. 2A is a cross-sectional view taken along line A-A in FIG. 1A.

Reference is made to FIGS. 2A and 2B. FIG. 2A is a cross-sectional view taken along line A-A in the IC structure layout including a FRAM structure of FIG. 1A. FIG. 2B is a local enlarged view of the FRAM structure according to a region in FIG. 2A. As shown in FIG. 2A, the IC structure 100 is fabricated using five metallization layers, labeled as M1 through M5, with five layers of metallization vias or interconnects, labeled as V1 through V5. Other embodiments may contain more or fewer metallization layers and a corresponding more or fewer number of vias. The logic region 102B includes a full metallization stack, including a portion of each of metallization layers M1-M5 connected by interconnects V2-V5, with V1 connecting the stack to a source/drain contact of the logic transistor 902. The memory region 102A includes a full metallization stack connecting the memory cells 134 to transistors 912 in the memory region 102A, and a partial metallization stack connecting a source line to the transistors 912 in the memory region 102A. The memory cells 102A are depicted as being fabricated in between the M4 layer and the M5 layer. The memory cell 102A may further include the top electrode via 154. The bottom electrode layer 136 is electrically connected with the metallization layer M4 through a bottom electrode via, and the top electrode via 154 is electrically connected with the metallization layer M5 through the top electrode via 154. Also included in integrated circuit is a plurality of ILD layers. Six ILD layers, identified as ILD0 through ILD5 are depicted in FIG. 2A as spanning the logic region 102B and the memory region 102A. The ILD layers may provide electrical insulation as well as structural support for the various features of the integrated circuit during many fabrication process steps.

In FIG. 2B, the dielectric layer 112 (which may also be referred to as an inter-metal dielectric layer) may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiment, the dielectric layer 112 may include SiCN, SiCO, $SiO_2$, SiN, SiC and AlON, combinations thereof, or other suitable materials. In some embodiment, a dielectric constant (k) of the dielectric layer 112 is less than about 2.5.

In FIG. 2B, the bottom conductive line 106 is embedded in the dielectric layer 112. In some embodiments, the bottom conductive line 106 may include copper, Pt, Ru, aluminum, tantalum, tungsten, tantalum nitride (TaN), titanium, titanium nitride (TiN), combinations thereof, or other suitable materials. In some embodiments, a top surface of the bottom conductive line 106 is substantially level with a top surface of the dielectric layer 112.

In FIG. 2B, a dielectric layer 144 extends along a top surface of the dielectric layer 112. In some embodiments, the dielectric layer 144 has an opening exposing the bottom conductive line 106 and a width of the opening is less than a width W1 of the bottom conductive line 106 when view from a cross section taken along the second direction. In some embodiments, the dielectric layer 144 overlaps a portion of the bottom conductive line 106.

In some embodiments, the dielectric layer 144 may include SiCN, SiCO, $SiO_2$, SiN, SiC and AlON, combinations thereof, or other suitable materials. For example, the dielectric layer 144 may include SiC. In some embodiments, a material of the dielectric layer 144 may be different form a material of the dielectric layer 112. In some embodiments, a material of the dielectric layer 144 may be substantially the same as a material of the dielectric layer 112.

In FIG. 2B, the bottom electrode layer 136 extends from the bottom conductive line 106 beyond a top surface of the dielectric layer 144. The bottom electrode layer 136 in contract with the bottom conductive line 106 and has an U-shaped when viewed in a cross section taken along the second direction. In some embodiments, the bottom electrode layer 136 may not overlap the dielectric layer 112. In some embodiments, the bottom electrode layer 136 may not overlap the dielectric layer 144.

Specifically, the bottom electrode layer 136 includes a pair of protruding portions 136t1 and 136t2 and a bottom portion 136b. The bottom portion 136b of the bottom electrode layer 136 is connected between the protruding portions 136t1 and 136t2. The bottom portion 136b of the bottom electrode layer 136 extends along a top surface of the bottom conductive line 106 and terminates prior to reaching the dielectric layer 112. In some embodiments, a width W2 of the bottom electrode layer 136 is less than the width W1 of the bottom conductive line 106 when view from a cross section taken along the second direction. In some embodiments, a top surface of the bottom portion 136b of the bottom electrode layer 136 is lower than a top surface of the dielectric layer 144. In some embodiments, a thickness T1 of the bottom portion 136b of the bottom electrode layer 136 is thinner than a thickness T2 of the dielectric layer 144 along a direction substantially perpendicular to the top surface of the dielectric layer 112. In some embodiments, the thickness T1 of the bottom portion 136b of the bottom electrode layer 136 is in a range about 10 nm to about 1000 nm. If the thickness T1 of the bottom portion 136b of the bottom electrode layer 136 is out of the range from about 10 nm to about 1000 nm, then in turn adversely affects the performance of the semiconductor device.

In greater detail, the protruding portions 136t1 and 136t2 of the bottom electrode layer 136 extend upward the conductive line 106 beyond the top surface of the dielectric layer 144. In some embodiments, thicknesses T3 of the protruding portions 136t1 and 136t2 of the bottom electrode layer 136 is thinner than the thickness T2 of the dielectric layer 144 along the second direction. In some embodiments, the thickness T3 of the protruding portions 136t1 and 136t2 of the bottom electrode layer 136 are in a range about 10 nm to about 1000 nm. If the thickness T1 of the protruding portion 136t1 or the protruding portion 136t2 of the bottom electrode layer 136 is out of the range from about 10 nm to about 1000 nm, then in turn adversely affects the performance of the semiconductor device.

In some embodiments, the bottom electrode layer 136 may include copper, Pt, Ru, aluminum, tantalum, tungsten, tantalum nitride (TaN), titanium, titanium nitride (TiN), combinations thereof, or other suitable materials. In some embodiments, the bottom electrode layer 136 may be formed by suitable processes such as plating, chemical vapor deposition (CVD), physical vapor deposition (PVD) and/or the like.

In FIG. 2B, a ferroelectric layer 138 conformally formed on the bottom electrode layer 136 and the dielectric layer 144. In some embodiments, the ferroelectric layer 138 has an U-shaped when viewed in a cross section taken along the second direction above the bottom conductive line 106.

In greater detail, the ferroelectric layer 138 extends along a top surface of the bottom portion 136b of the bottom electrode layer 136 and along inner sidewalls of the protruding portions 136t1 and 136t2 of the bottom electrode layer. The ferroelectric layer 138 extends beyond and along top surfaces of the protruding portions 136t1 and 136t2 of the bottom electrode layer. In some embodiments, the ferroelectric layer 138 extends across opposite two edges of the top surface of the protruding portions 136t1 of the bottom electrode layer 136. In some embodiments, the ferroelectric layer 138 extends across opposite two edges of the top surface of the protruding portions 136t2 of the bottom electrode layer 136. In some embodiments, the ferroelectric layer 138 extends along outer sidewalls of the protruding portions 136t1 and 136t2. In some embodiments, the ferroelectric layer 138 extends along a top surface of the dielectric layer 144.

In some embodiments, an area of an interface between the bottom electrode layer 136 and the ferroelectric layer 138 is greater than an area of an interface between the bottom electrode layer 136 and the first conductive line 106. As such, an effective area between the ferroelectric layer 138 and the bottom electrode layer 136 of the memory cell 134 is greater than a projection area of the memory cell 134 on the bottom conductive line 106 such that an effective area of capacitor and reliability may be improved.

In some embodiments, a portion of the ferroelectric layer 138 in contact with the bottom portion 136b of the bottom electrode layer 136 has a thickness T4 thicker than another portion of the ferroelectric layer 138 in contact with the protruding portion 136t1 or the protruding portion 136t2 of the bottom electrode layer 136. In some embodiments, the thickness T4 of the portion of the ferroelectric layer 138 in contact with the bottom portion 136b of the bottom electrode layer 136 is in a range about 1 nm to about 100 nm. If the thickness T4 of the portion of the ferroelectric layer 138 in contact with the bottom portion 136b of the bottom electrode layer 136 is out of the range from about 1 nm to about 100 nm, then in turn adversely affects the performance of the semiconductor device. In some embodiments, the thickness T5 of the portion of the ferroelectric layer 138 in contact with the protruding portion 136t1 or the protruding portion 136t2 of the bottom electrode layer 136 is in a range about 1 nm to about 100 nm. If the thickness T5 of the portion of the ferroelectric layer 138 in contact with the protruding portion 136t1 or the protruding portion 136t2 of the bottom electrode layer 136 is out of the range from about 1 nm to about 100 nm, then in turn adversely affects the performance of the semiconductor device.

In some embodiments, the ferroelectric layer 138 may include ferroelectric materials, for example, strontium bismuth tantalite (SBT), lead zirconate titanate (PZT), hafnium zirconium oxide (HZO), doped hafnium oxide (Si:HfO$_2$), the like, or combinations thereof. In some embodiments, the ferroelectric layer 138 may include PZT, SBT, HfO2 dopped Si, Zr, Y, Al, Gd, Sr, La, Sc, Ge, the like, or combinations thereof. The ferroelectric layer 138 may be formed by chemical vapor deposition (CVD), such as high density plasma CVD (HDPCVD), plasma enhanced CVD (PECVD), atomic layer deposition (ALD), plasma enhanced ALD (PEALD), combinations thereof, and other suitable techniques.

In FIG. 2B, the top electrode layer 156 is formed over the ferroelectric layer 138. Specifically, the top electrode layer 156 extends along a sidewall and a top surface of the ferroelectric layer 138. In some embodiments, the top electrode layer 156 of the memory cell 134 may have an m-shaped when viewed in a cross section taken along the second direction. In some embodiments, the memory cell 134 may be referred to as a 3-dimension (3D) m-shape structure. In some embodiments, an interface between the ferroelectric layer and the top electrode layer is greater than an area of an interface between the bottom electrode layer and the first conductive line. As such, an effective area between the top electrode layer 156 and the ferroelectric layer 138 of the memory cell 134 is greater than a projection area of the memory cell 134 on the bottom conductive line 106, such that an effective area of capacitor and reliability may be improved.

In some embodiments, the top electrode layer 156 may be formed by suitable processes such as plating, chemical vapor deposition (CVD), physical vapor deposition (PVD) and/or the like. In some embodiments, the top electrode layer 156 may include copper, Pt, Ru, aluminum, tantalum, tungsten, tantalum nitride (TaN), titanium, titanium nitride (TiN), combinations thereof, or other suitable materials.

In FIG. 2B, an etch stop layer 148 is conformally formed over the top electrode layer 156. In some embodiments, the etch stop layer 148 may include SiCN, SiCO, SiO$_2$, SiN, SiC and AlON, combinations thereof, or other suitable materials. In FIG. 2B, a protective liner layer 150 is conformally formed over the etch stop layer 148. In some embodiments, the protective liner layer 150 may include a low-K dielectric material such as tetraethylorthosilicate (TEOS) oxide, un-doped silicate glass, or doped silicon oxide such as borophosphosilicate glass (BPS G), fused silica glass (FSG), phosphosilicate glass (PSG), boron doped silicon glass (BSG), and/or other suitable dielectric materials. In some embodiments, a material of the etch stop layer 148 is different from a material of the protective liner layer 150 and then an interface exists therebetween.

In FIG. 2B, the IMD layer 152 is formed over the protective liner layer 150 and fills a gap between two neighboring memory cells 134 as shown in FIG. 1B. In some embodiments, the IMD layer 152 may be formed using chemical vapor deposition (CVD) such as LPCVD, PECVD, and FCVD. In some embodiments, the top surface of the IMD layer 152 is planarized. In FIG. 2B, the IMD layer 152 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HS Q), porous methyl silsesquioxane (MSQ), porous polyarylether (PAE), porous SiLK, or porous silicon oxide (SiO$_2$) In some embodiment, the dielectric layer 112 may include SiCN, SiCO, SiO$_2$, SiN, SiC and AlON, combinations thereof, or other suitable materials. In some embodiment, a dielectric constant (k) of the dielectric layer 112 is less than about 2.5.

In some embodiments, a material of the IMD layer 152 may be different form a material of the protective liner layer 150.

In FIG. 2B, the top electrode via 154 penetrates through the protective liner layer 150 and the etch stop layer 148 and is in contact with the top electrode layer 156. In FIG. 2B, a conductive line 158 embedded in the IMD layer 152 and extending along the first direction (see FIG. 1B). In some embodiments, the ferroelectric layer 138 of the memory cell 134 extends across the conductive line 158. In some embodiments, the top electrode layer 156 of the memory cell 134 extends across the conductive line 158. In some embodiments, the top electrode via 154 non-overlaps the bottom conductive line 106. In some embodiments, the top electrode via 154 non-overlaps the bottom electrode layer 136. In some embodiments, the top electrode via 154 and the conductive line 158 may land on a periphery of cell line and non-overlaps the memory cell 134, such that the top electrode via 154 may not align the memory cell 134 so as to improve the process window. In some embodiments, the top electrode via 154 may include copper, Pt, Ru, aluminum, tantalum, tungsten, tantalum nitride (TaN), titanium, titanium nitride (TiN), combinations thereof, or other suitable materials. In some embodiments, the conductive line 158 may include copper, Pt, Ru, aluminum, tantalum, tungsten, tantalum nitride (TaN), titanium, titanium nitride (TiN), combinations thereof, or other suitable materials.

Figure 3A:
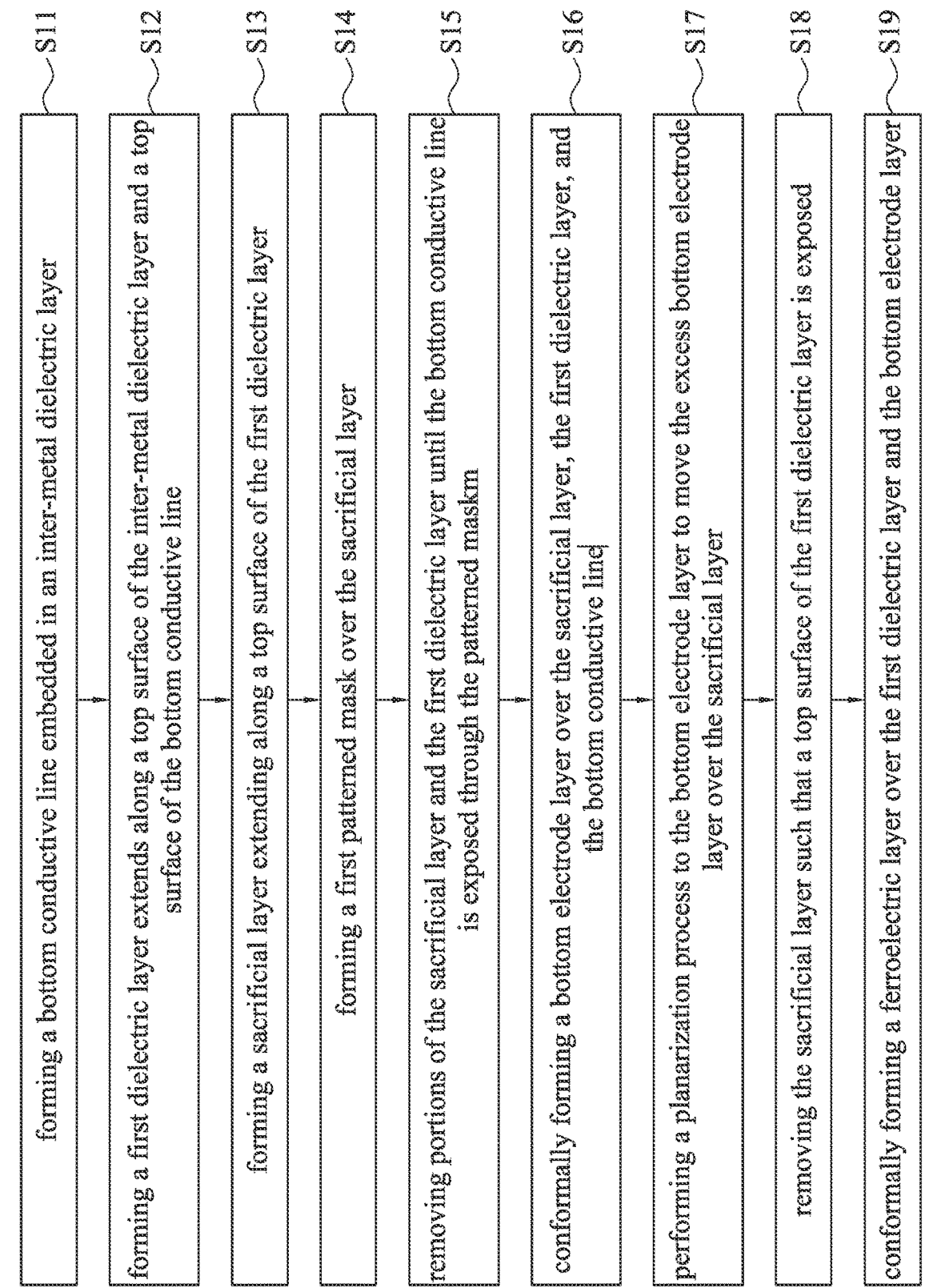
FIGS. 3A and 3B are flow charts of a method of forming an IC structure according to various aspects of the present disclosure.
Figure 3B:
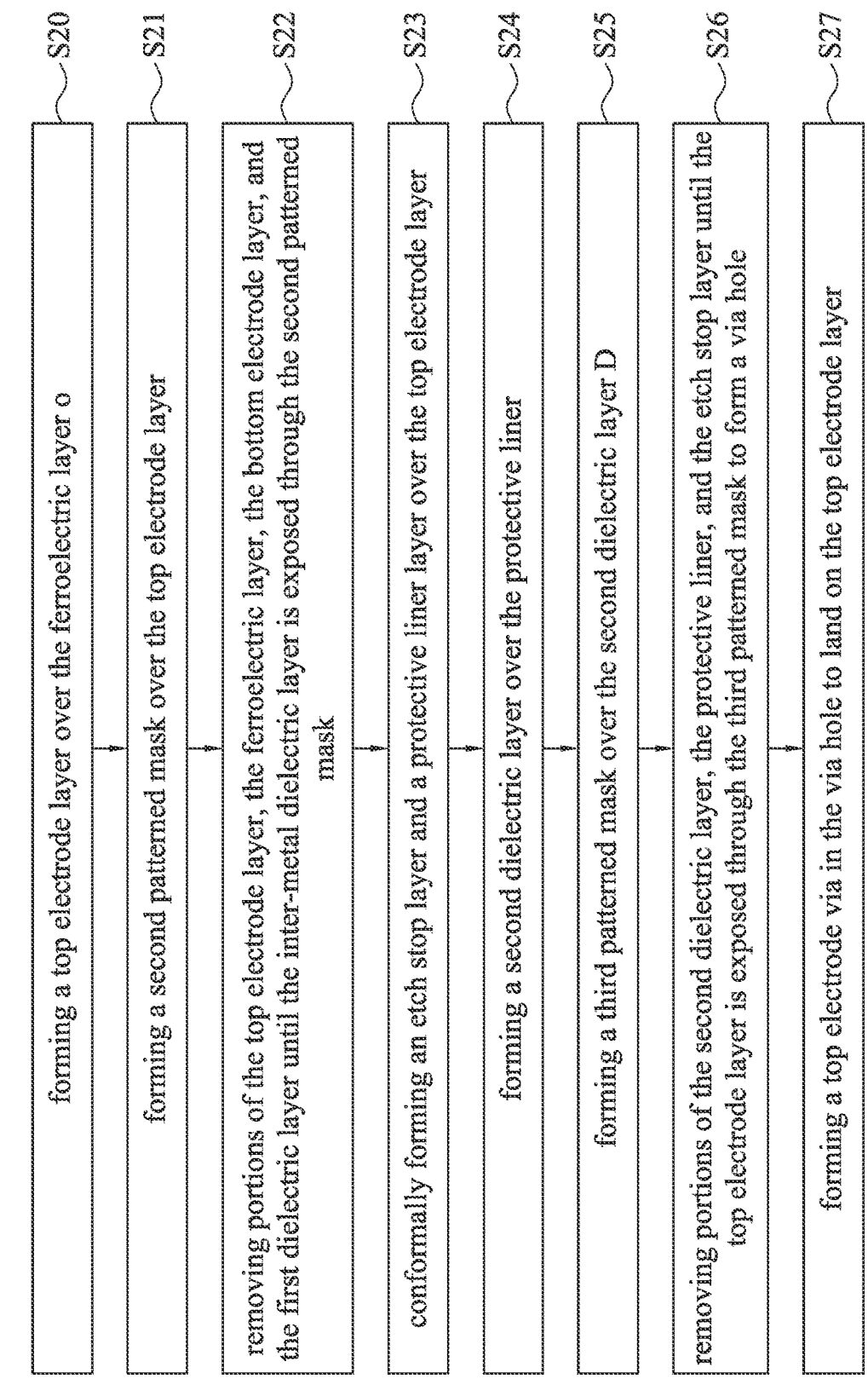

Referring now to FIGS. 3A and 3B, illustrated are an exemplary method M for fabrication of an integrated circuit (IC) structure in accordance with some embodiments. The method M includes a relevant part of the entire manufacturing process. It is understood that additional operations may be provided before, during, and after the operations shown by FIGS. 3A and 3B, and some of the operations described below can be replaced or eliminated for additional embodiments of the method. The order of the operations/processes may be interchangeable. The method M includes fabrication of an IC structure 100 including a ferroelectric random access memory (FRAM) cell. However, the fabrication of the IC structure is merely example for describing the improved IC structure process according to some embodiments of the present disclosure.

FIGS. 4-19 illustrate an IC structure 100 at various stages of the method M according to some embodiments of the present disclosure. The method M begins at block S11 where a bottom conductive line is formed and embedded in an inter-metal dielectric layer. With reference to FIG. 4, a bottom conductive line 106 embedded in the dielectric layer 144 of the IC structure 100 is formed. The IC structure 100 includes a logic region 102B and a memory region 102A. The logic region 102B may include circuitry, such as an exemplary logic transistor. The memory region 102A can correspond to an array of memory cells (which may be also referred to as ferroelectric random access memory (FRAM) structures) while the logic device portion 102B can couple logic devices, such as transistors formed in a substrate underlying thereof, to support operation of the memory cells.

In some embodiments, the dielectric layer 112 (which may also be referred to as an inter-metal dielectric layer) may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$) In some embodiment, the dielectric layer 112 may include SiCN, SiCO, $SiO_2$, SiN, SiC and AlON, combinations thereof, or other suitable materials. In some embodiment, a dielectric constant (k) of the dielectric layer 112 is less than about 2.5.

In some embodiments, the bottom conductive line 106 may include copper, Pt, Ru, aluminum, tantalum, tungsten, tantalum nitride (TaN), titanium, titanium nitride (TiN), combinations thereof, or other suitable materials. In some embodiments, the bottom conductive line 106 is formed by forming a conductive material layer (not shown) over the dielectric layer 114 over the memory region 102A and filling in a via opening (not shown) exposing the one of the source/drain regions of a transistor (not shown) by suitable processes such as plating, chemical vapor deposition (CVD), physical vapor deposition (PVD) and/or the like, and then removing the conductive material layer outside the dielectric layer 104 by suitable processes such as chemical mechanical polishing (CMP), etching and/or the like.

Returning to FIG. 3A, the method M then proceeds to block S12 where a first dielectric layer is formed to extend along a top surface of the inter-metal dielectric layer and a top surface of the bottom conductive line. With reference to FIG. 5, a dielectric layer 144 is formed to extend along a top surface of the dielectric layer 112 and a top surface of the bottom conductive line 106. In some embodiments, the dielectric layer 144 may include SiCN, SiCO, $SiO_2$, SiN, SiC and AlON, combinations thereof, or other suitable materials. For example, the dielectric layer 144 may include SiC. In some embodiments, a material of the dielectric layer 144 may be different form a material of the dielectric layer 112. In some embodiments, a material of the dielectric layer 144 may be substantially the same as a material of the dielectric layer 112. In some embodiments, the dielectric layer 144 may be formed using chemical vapor deposition (CVD) such as LPCVD, PECVD, and flowable CVD (FCVD). In some embodiments, the top surface of the dielectric layer 144 may be planarized.

Returning to FIG. 3A, the method M then proceeds to block S13 where a sacrificial layer is formed to extend along a top surface of the first dielectric layer. With reference to FIG. 5, a dielectric layer 145 (may also be referred to as a sacrificial layer) is formed to extend along a top surface of the dielectric layer 144. In some embodiments, the dielectric layer 145 may include SiCN, SiCO, $SiO_2$, SiN, SiC and AlON, combinations thereof, or other suitable materials. In some embodiments, the dielectric layer 145 may include $SiO_x$. In some embodiments, a material of the dielectric layer 145 may be different form a material of the dielectric layer 144. For example, the dielectric layer 145 may include $SiO_x$, and the dielectric layer 144 may include SiC. In some embodiments, the dielectric layer 145 may include oxide-containing material, and the dielectric layer 144 may include carbon-containing material. In some embodiments, the dielectric layer 145 may be a carbon-free dielectric layer. In some embodiments, the dielectric layer 144 may be a oxide-free dielectric layer.

In some embodiments, the dielectric layer 145 may be formed using chemical vapor deposition (CVD) such as LPCVD, PECVD, and flowable CVD (FCVD). In some embodiments, the top surface of the dielectric layer 145 may be planarized.

Figure 6:
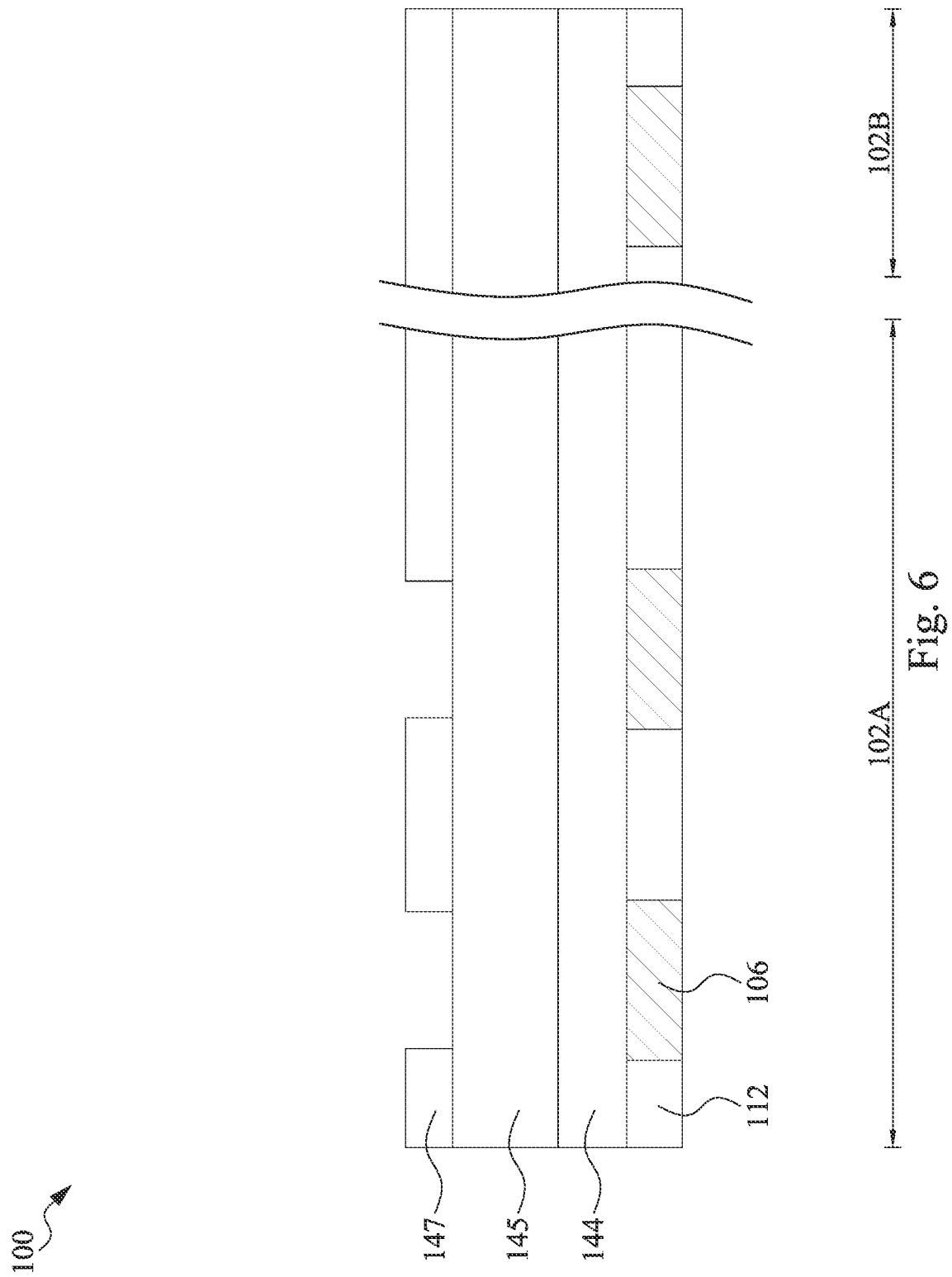

Returning to FIG. 3A, the method M then proceeds to block S14 where a first patterned mask is formed over the sacrificial layer. With reference to FIG. 6, a patterned mask layer 147 is formed over the dielectric layer 145 and patterned to form separated mask portions. The patterned mask layer 147 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 7:
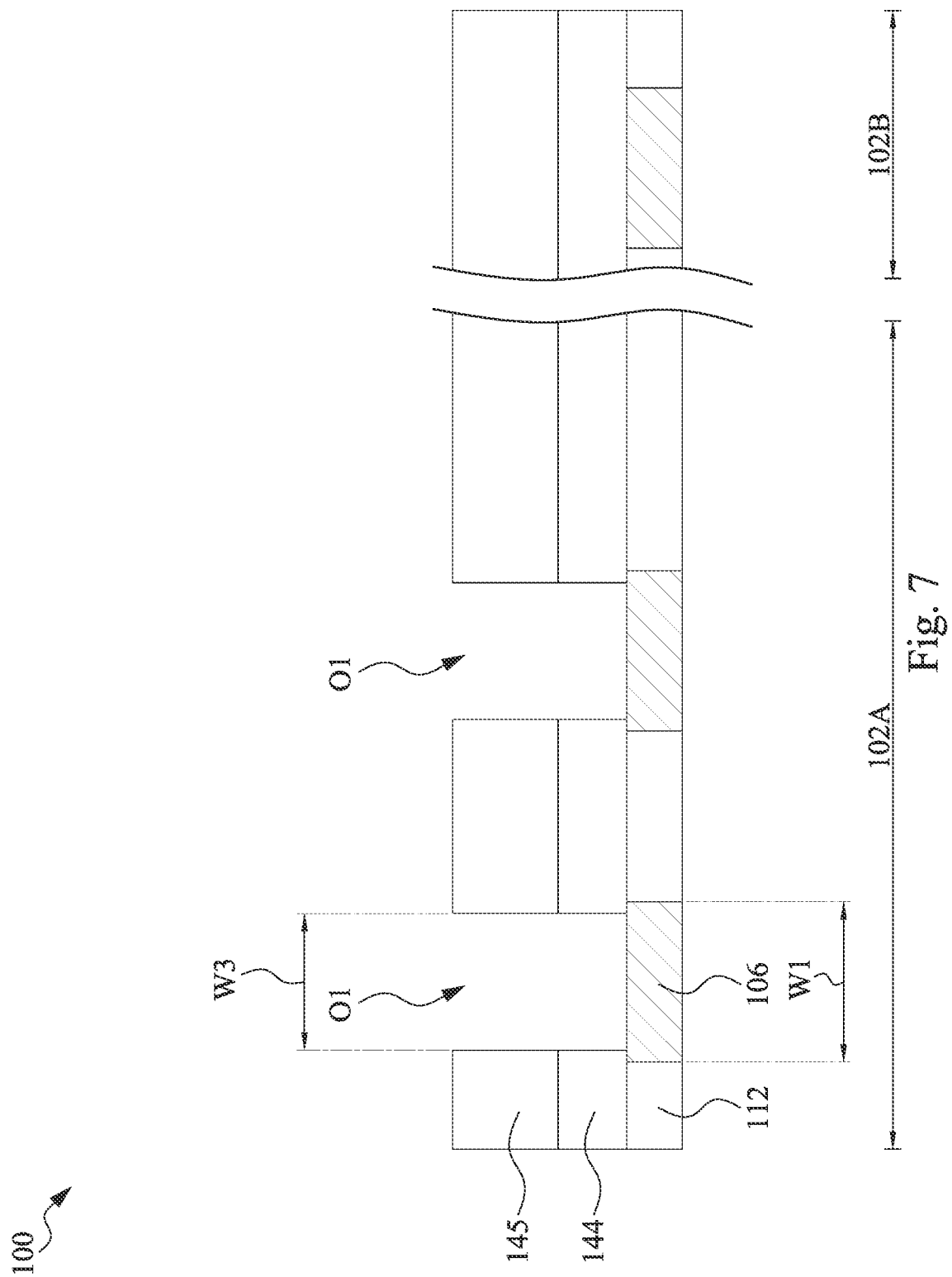

Returning to FIG. 3A, the method M then proceeds to block S15 where portions of the sacrificial layer and the first dielectric layer are moved until the bottom conductive line is exposed through the patterned mask. With reference to FIG. 7, one or more etching processes are performed to form an opening O1 exposing the bottom conductive line 106 of the memory region 102A using the patterned mask 147 as an etching mask, while the dielectric layers 144 and 145 of the logic region 102B remains, and the patterned mask layer 147 is removed after the etching. The width W3 of the opening O1 is less than the width W1 of the bottom conductive line 106 when view from a cross section taken along the second direction. In some embodiments, the dielectric layers 144 and 145 overlap a portion of the bottom conductive line 106.

Figure 8:
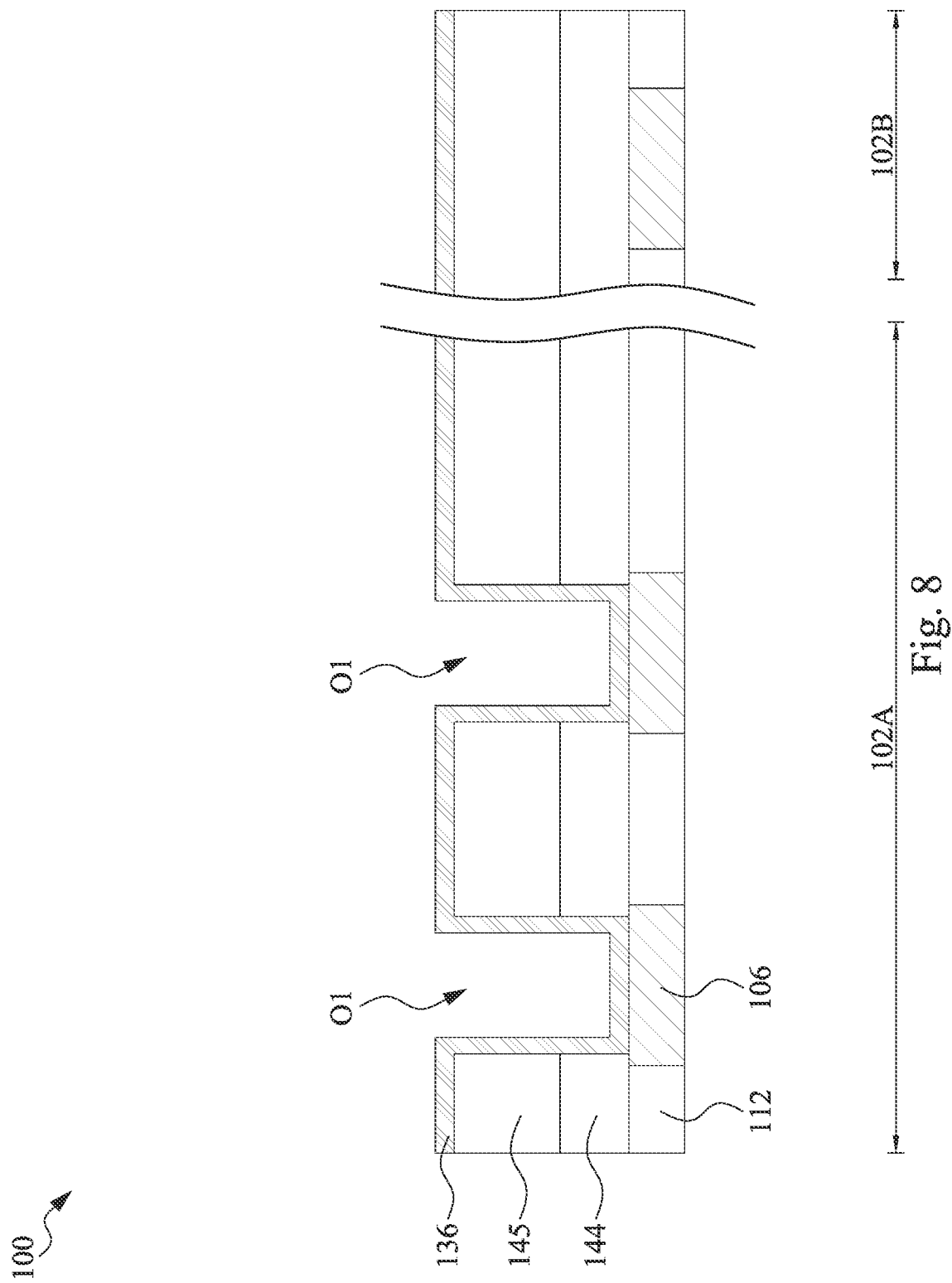

Returning to FIG. 3A, the method M then proceeds to block S16 where a bottom electrode layer is conformally formed over the sacrificial layer, the first dielectric layer, and the bottom conductive line. With reference to FIG. 8, a bottom electrode layer 136 is conformally formed over the dielectric layers 144 and 145 and the bottom conductive line 106. Specifically, the bottom electrode layer 136 lines a sidewall of the opening O1 and top surfaces of the bottom conductive line 106 and the dielectric layer 145. In some embodiments, the bottom electrode layer 136 may include copper, Pt, Ru, aluminum, tantalum, tungsten, tantalum nitride (TaN), titanium, titanium nitride (TiN), combinations thereof, or other suitable materials. In some embodiments, the bottom electrode layer 136 may be formed by suitable processes such as plating, chemical vapor deposition (CVD), physical vapor deposition (PVD) and/or the like.

Figure 9:
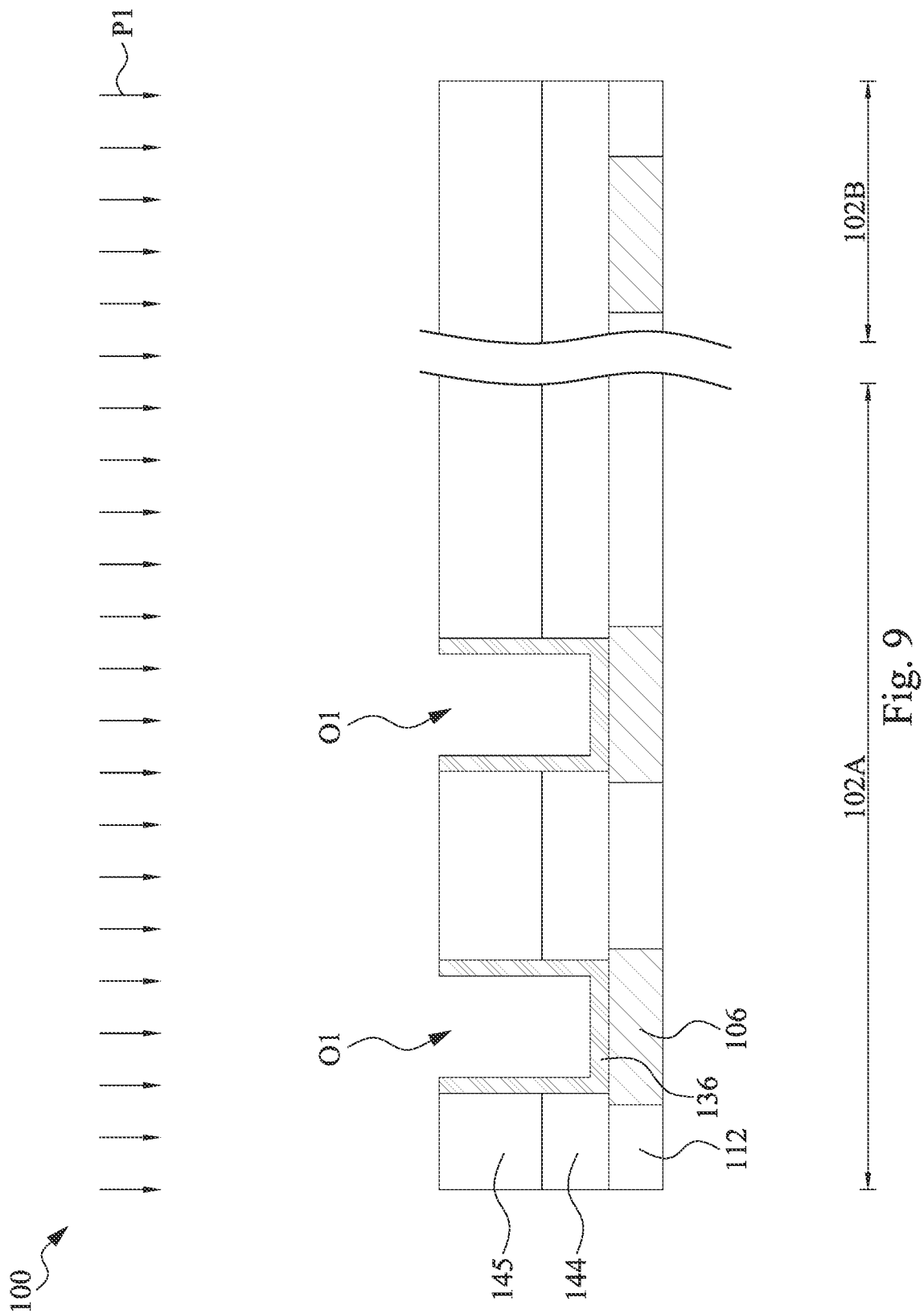

Returning to FIG. 3A, the method M then proceeds to block S17 where a planarization process is performed to the bottom electrode layer so as to move the excess bottom electrode layer over the sacrificial layer. With reference to FIG. 9, a planarization process P1 such as chemical mechanical polish (CMP) is performed to remove the excess bottom electrode layer 136 over the dielectric layer 145. In such embodiments, the dielectric layer 145 may act as the CMP stop layer in the planarization. In greater detail, the CMP process uses slurry that removes the bottom electrode material at a faster removal rate than it removes the material of dielectric layer 145 (e.g., $SiO_x$).

Figure 10:
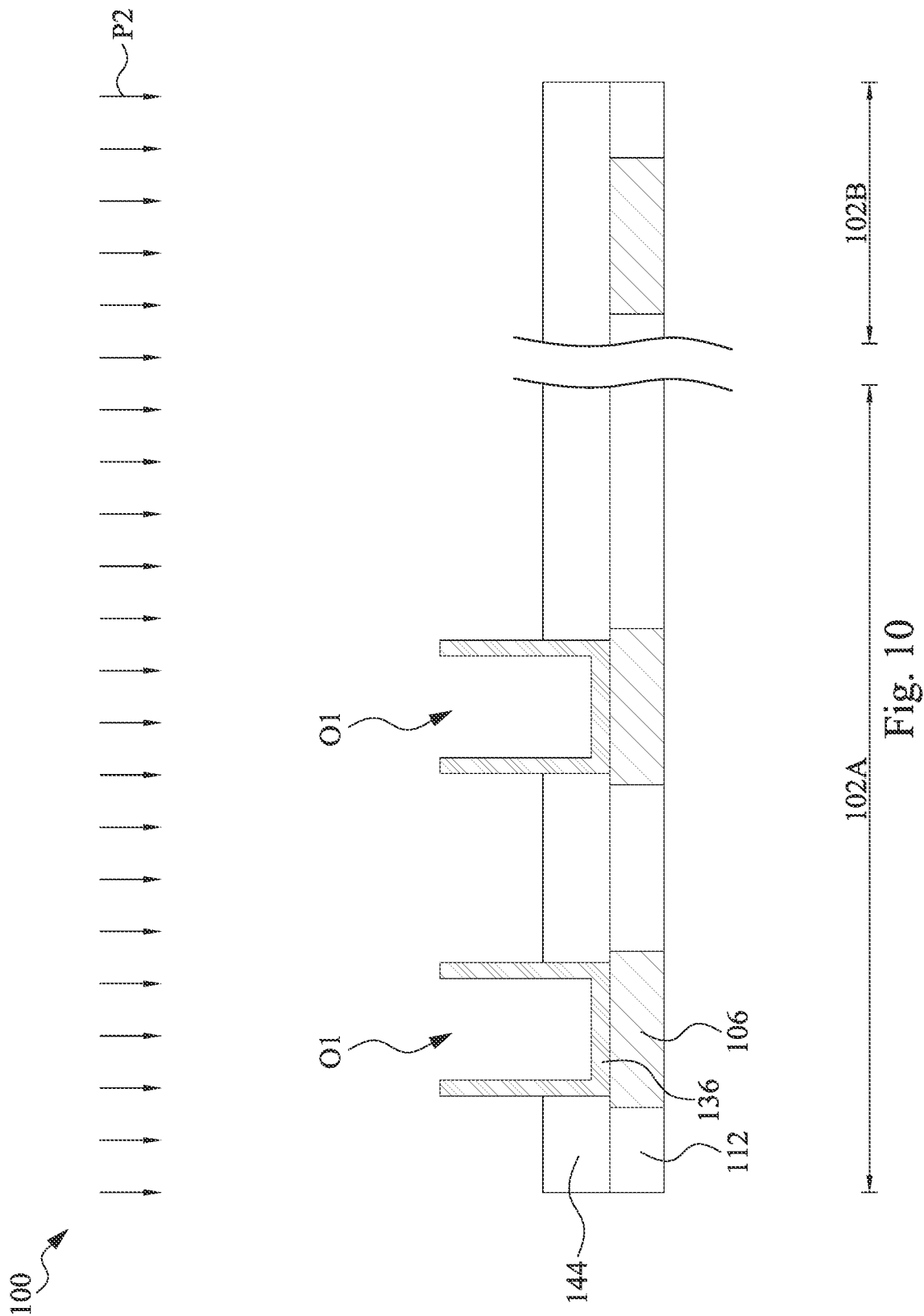

Returning to FIG. 3A, the method M then proceeds to block S18 where the sacrificial layer is removed such that a top surface of the first dielectric layer is exposed. With reference to FIG. 10, the dielectric layer 145 is removed, such that the bottom electrode layer 136 in contract with the bottom conductive line 106 and has an U-shaped when viewed in a cross section taken along the second direction. In some embodiments, the dielectric layer 145 is removed by an etching process P2. In some embodiments, an etching resistance of the dielectric layer 144 is greater than an etching resistance of the dielectric layer 145. Stated another way, the etching process P2 is a selective etching process that etches the dielectric layer 145 at a faster etch rate than it etches the bottom electrode layer 136. In some embodiments, the dielectric layer 145 is removed by a wet etching. In some embodiments, the dielectric layer 145 is removed by an etching operation, in which diluted HF, SiCoNi (including HF and $NH_3$), or the like, may be used as the etchant. After removing the dielectric layer 145, the bottom electrode layer 136 is higher than a top surface of the dielectric layer 144.

Figure 11:
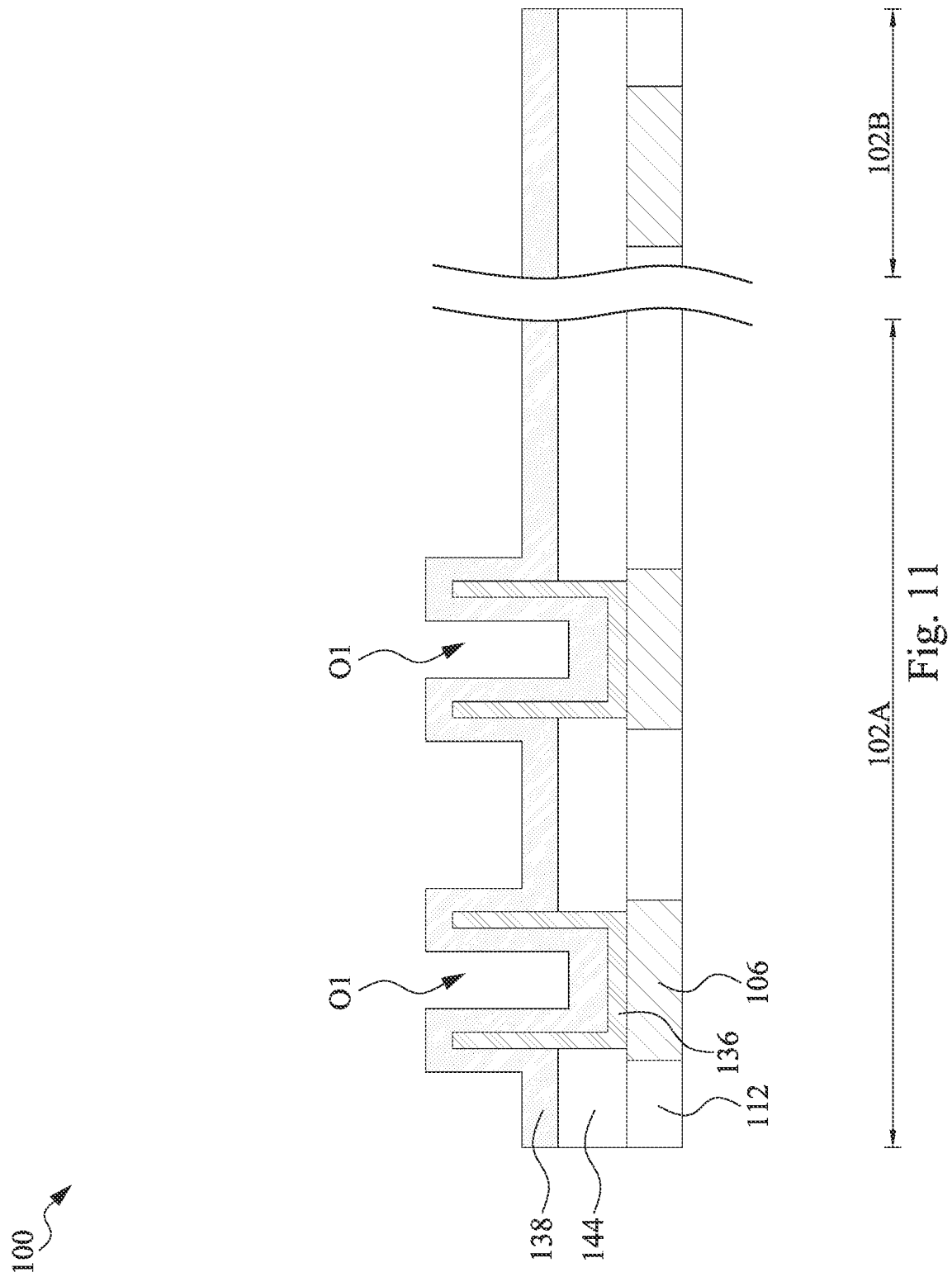

Returning to FIG. 3A, the method M then proceeds to block S19 where a ferroelectric layer is conformally formed over the first dielectric layer and the bottom electrode layer. With reference to FIG. 11, a ferroelectric layer 138 conformally formed on the bottom electrode layer 136 and the dielectric layer 144. In some embodiments, the ferroelectric layer 138 has an U-shaped when viewed in a cross section taken along the second direction above the bottom conductive line planar. In some embodiments, the ferroelectric layer 138 may include ferroelectric materials, for example, strontium bismuth tantalite (SBT), lead zirconate titanate (PZT), hafnium zirconium oxide (HZO), doped hafnium oxide (Si:$HfO_2$), the like, or combinations thereof. The ferroelectric layer 138 may be formed by chemical vapor deposition (CVD), such as high density plasma CVD (HDPCVD), plasma enhanced CVD (PECVD), atomic layer deposition (ALD), plasma enhanced ALD (PEALD), combinations thereof, and other suitable techniques.

Figure 12A:
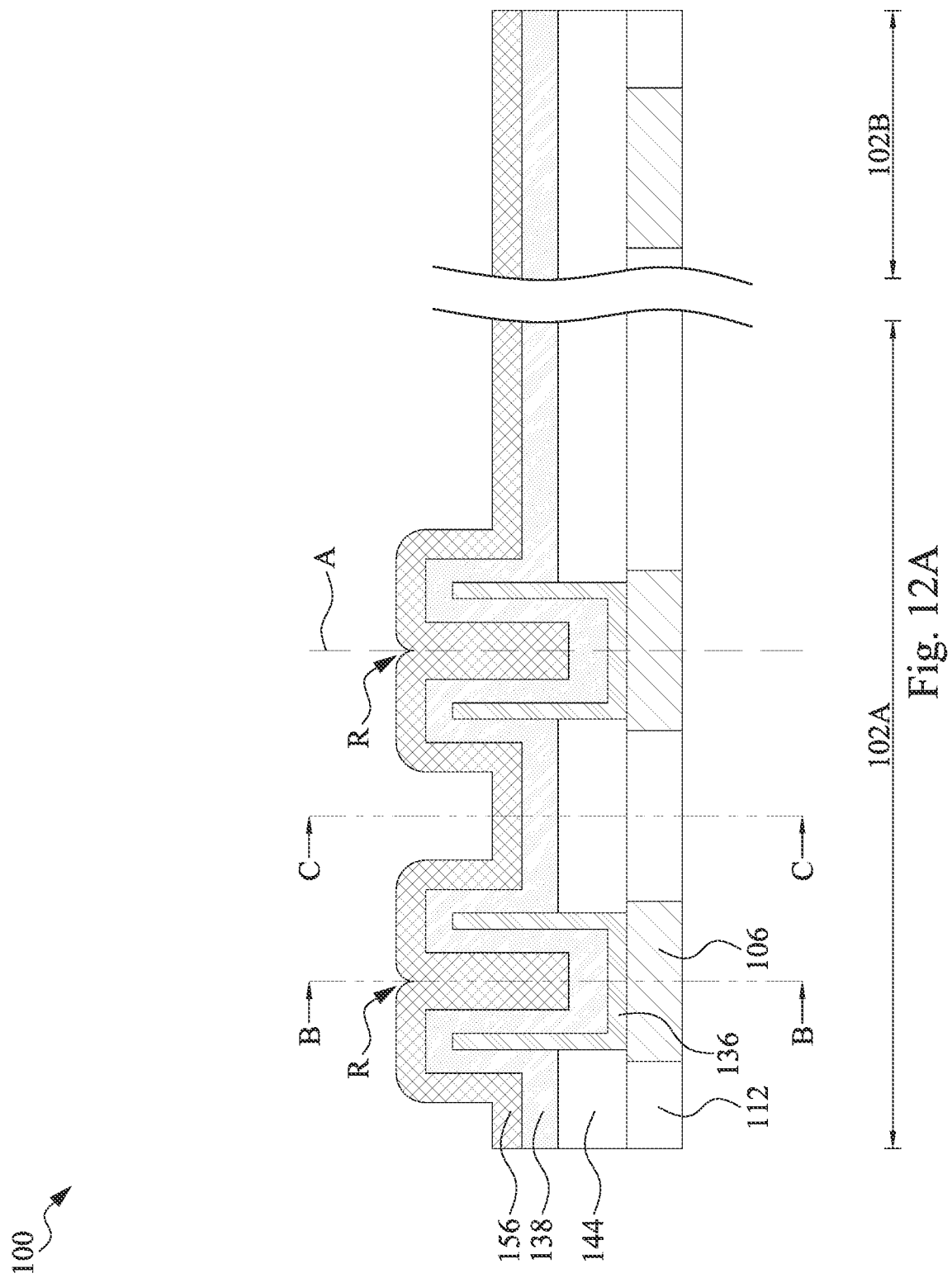
Figure 12C:
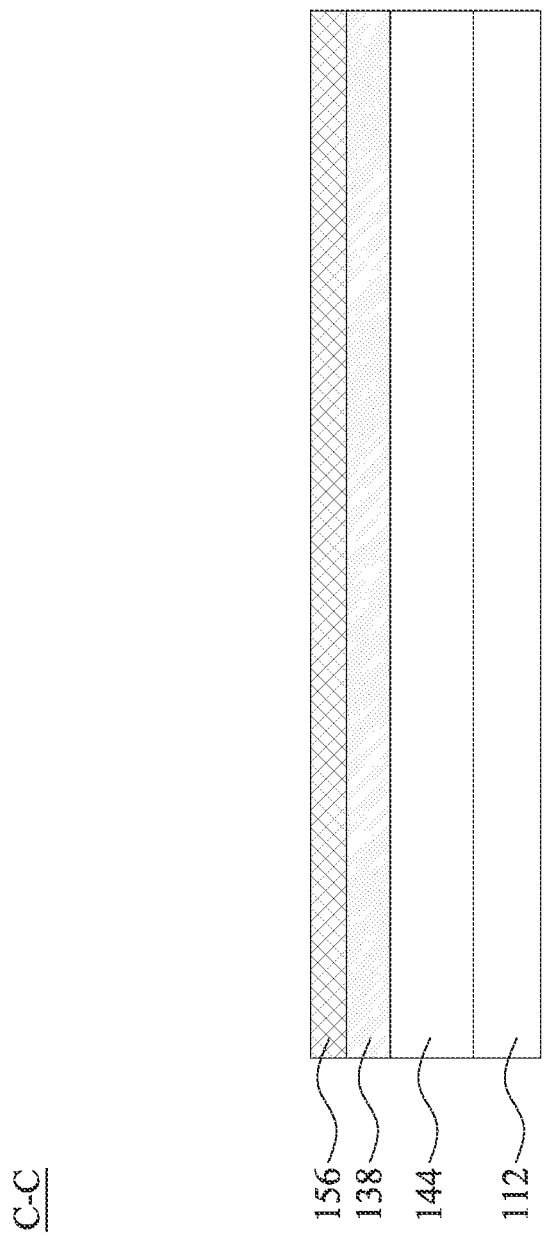
FIG. 12C is a cross-sectional view taken along line C-C in FIG. 12A.

Returning to FIG. 3B, the method M then proceeds to block S20 where a top electrode layer is formed over the ferroelectric layer. With reference to FIGS. 12A-12C, the top electrode layer 156 is formed over the ferroelectric layer 138. In some embodiments, the top electrode layer 156 may be formed by suitable processes such as plating, chemical vapor deposition (CVD), physical vapor deposition (PVD) and/or the like. In some embodiments, the top electrode layer 156 may include copper, Pt, Ru, aluminum, tantalum, tungsten, tantalum nitride (TaN), titanium, titanium nitride (TiN), combinations thereof, or other suitable materials. In some embodiments, the top electrode layer 156 has recesses R at its topmost surface due to nature of deposition, and symmetrical axes A of the bottom electrodes 136 vertically pass through the recesses R, respectively.

Figure 13A:
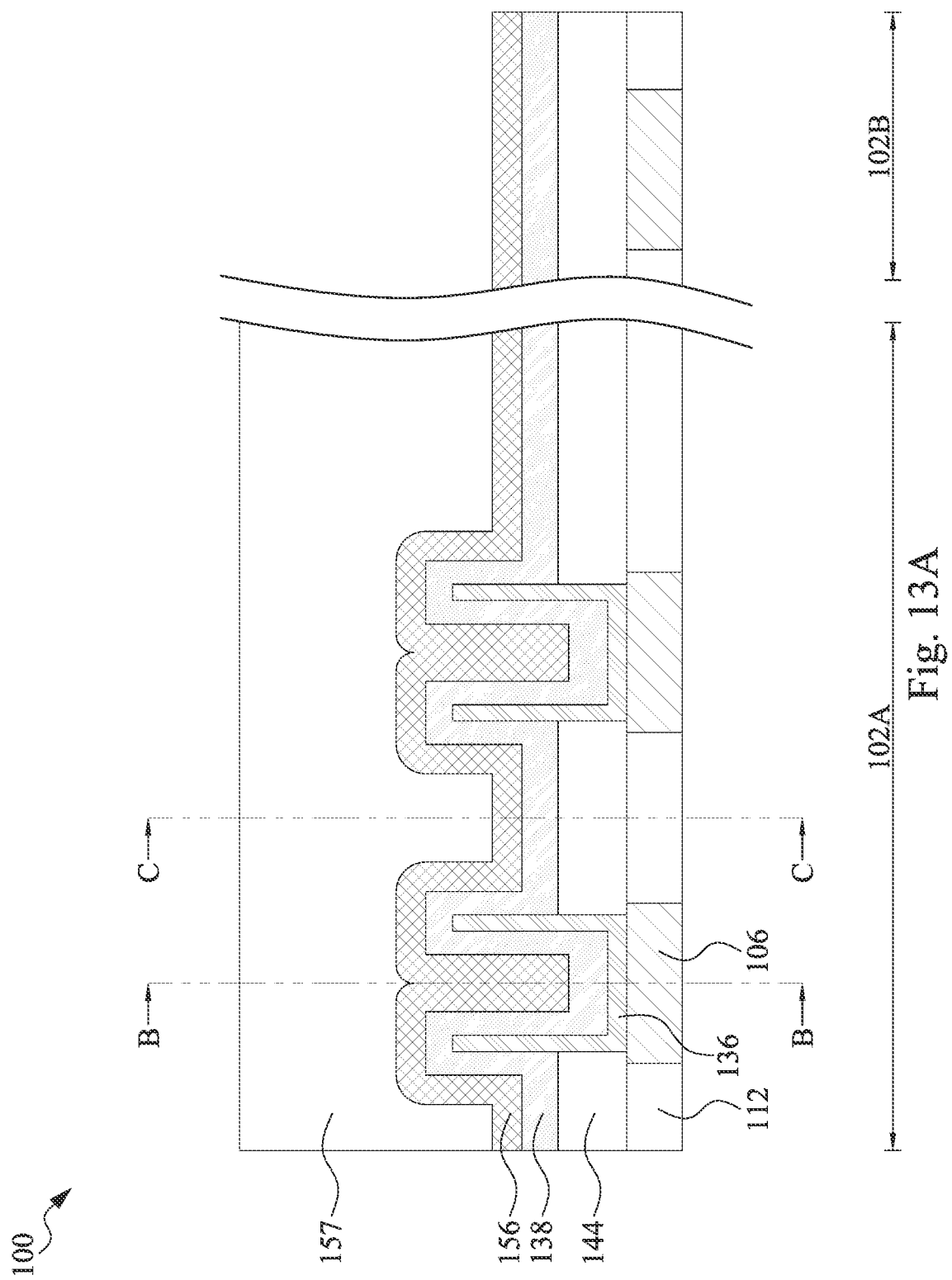
Figure 13B:
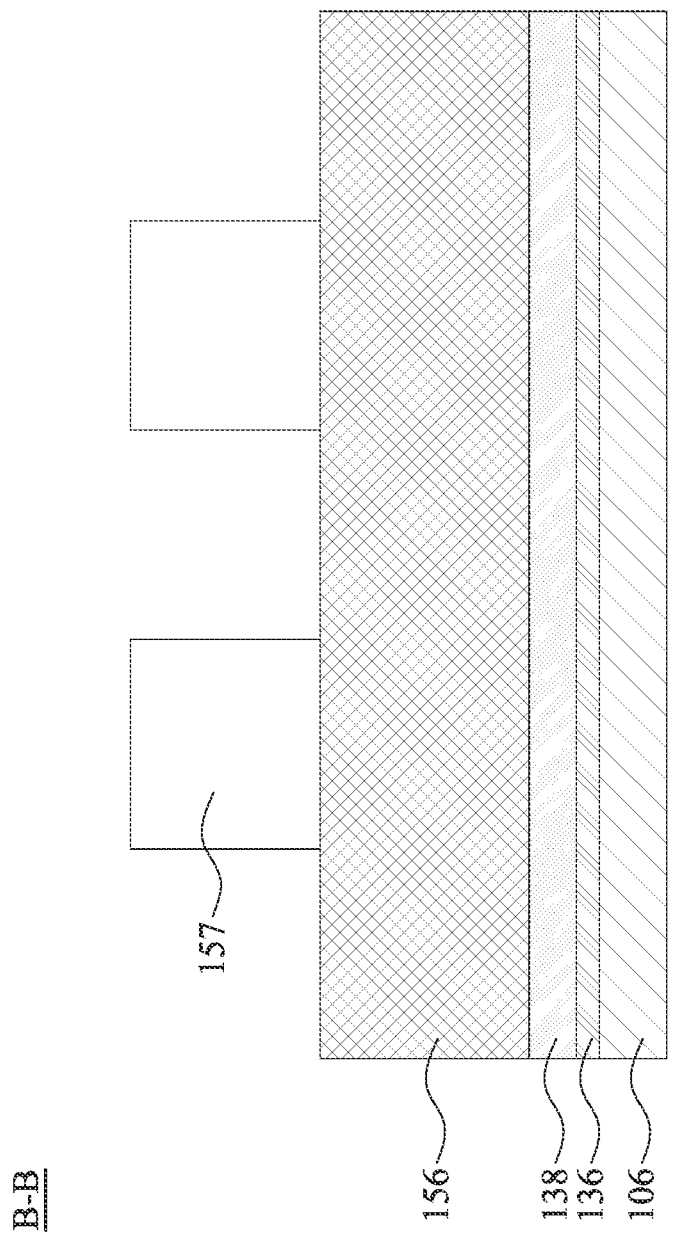
FIG. 13B is a cross-sectional view taken along line B-B in FIG. 13A.
Figure 13C:
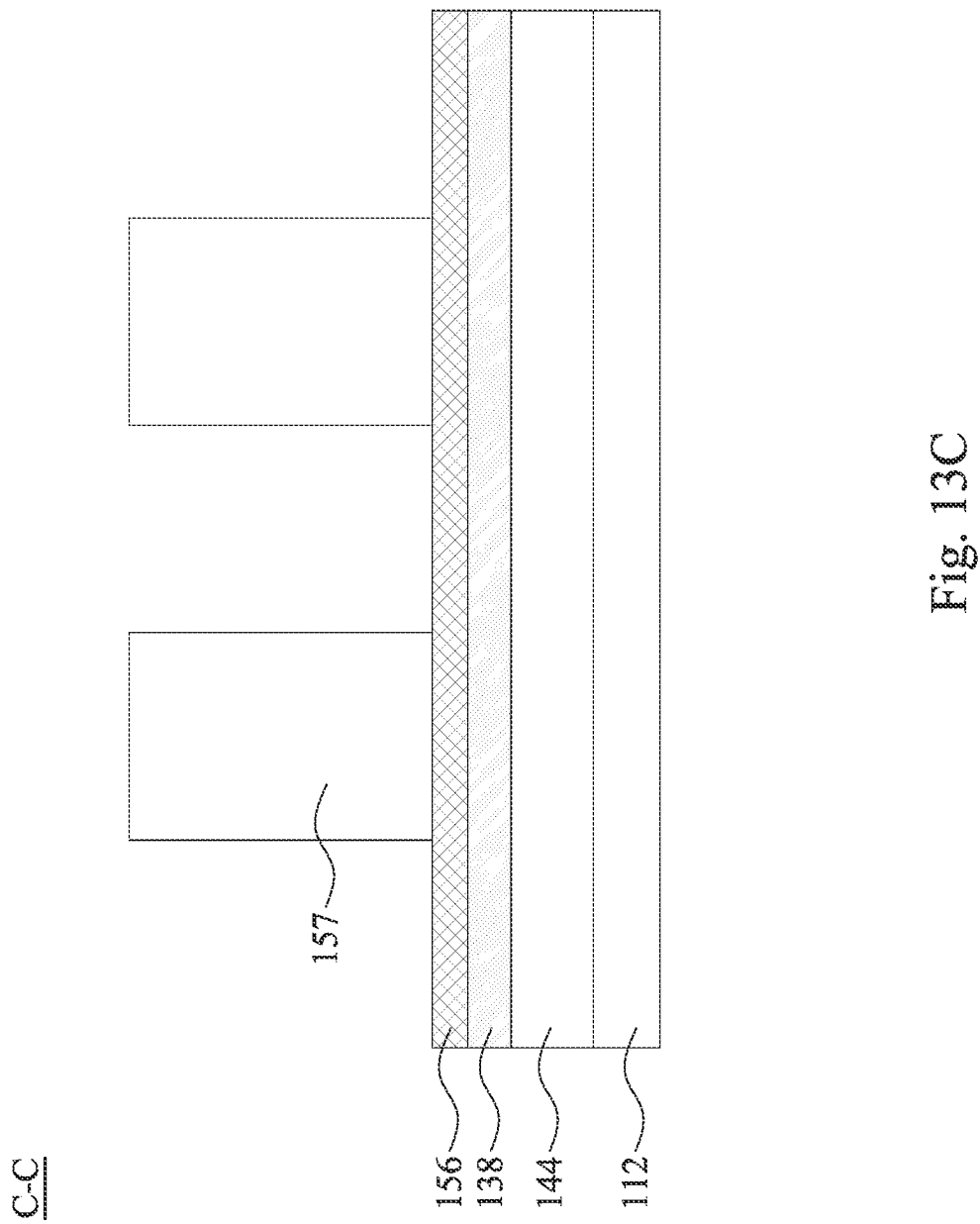
FIG. 13C is a cross-sectional view taken along line C-C in FIG. 13A.

Returning to FIG. 3B, the method M then proceeds to block S21 where a second patterned mask is formed over the top electrode layer. With reference to FIGS. 13A-13C, a patterned mask layer 157 is formed over the top electrode layer 156 and patterned to form separated mask portions. Specifically, the patterned mask layer 157 covers portions of the memory region 102A (See FIGS. 13B and 13C) and exposes the logic device portion 102B (See FIG. 13A). In some embodiments, the patterned mask layer 157 exposes entirety of the logic device portion 102B.

In some embodiments, the patterned mask layer 157 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 14A:
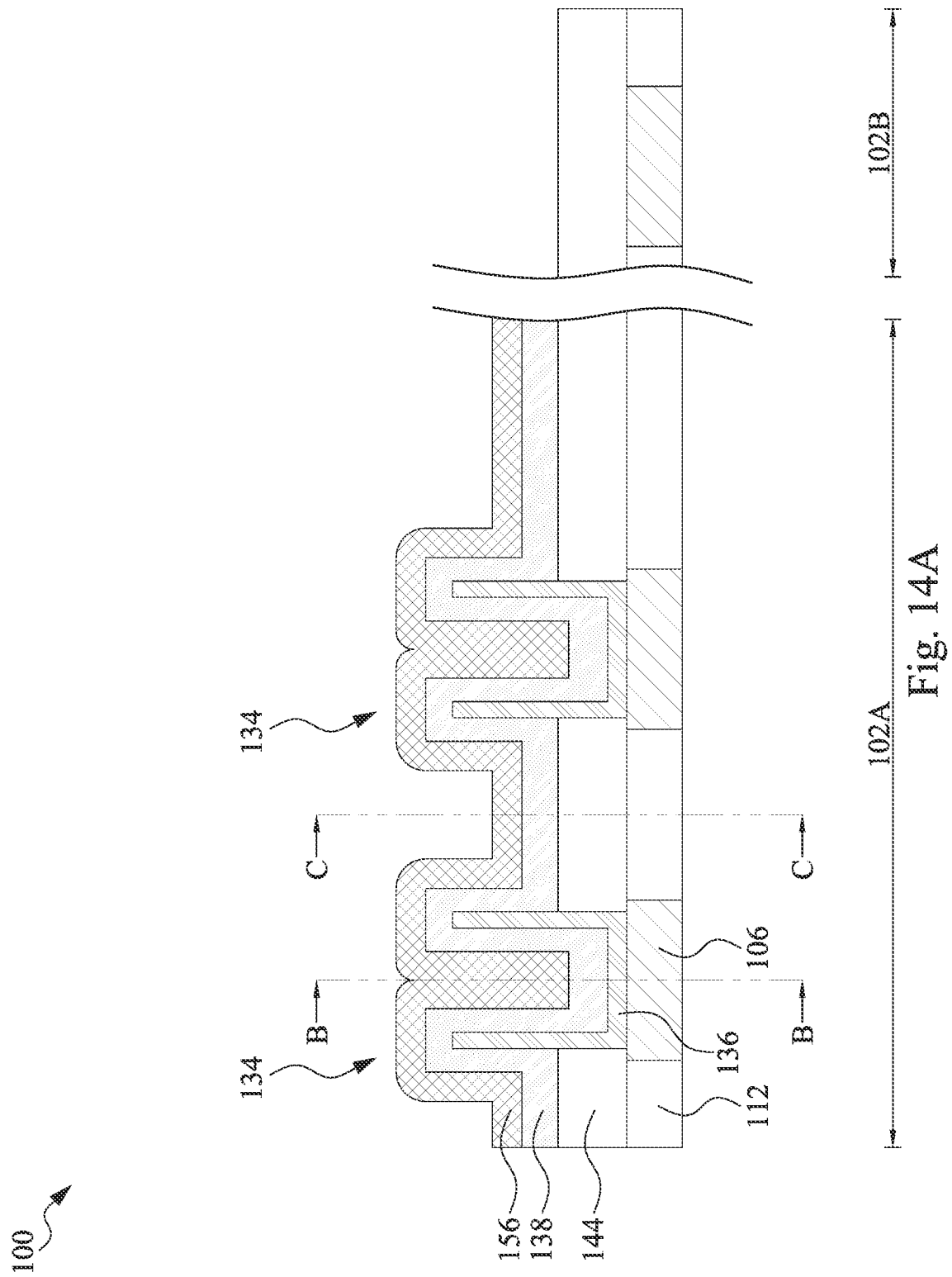
Figure 14C:
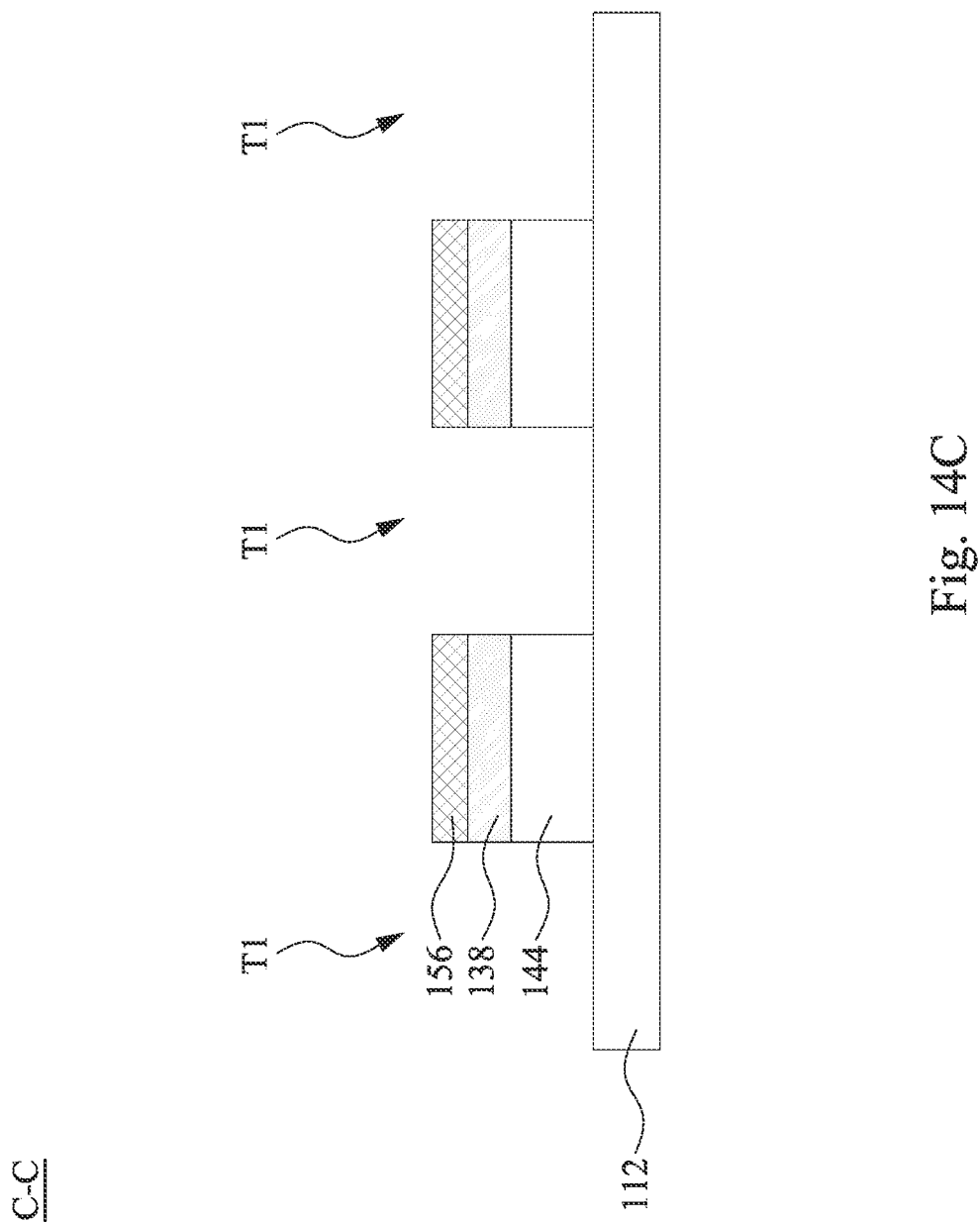
FIG. 14C is a cross-sectional view taken along line C-C in FIG. 14A.

Returning to FIG. 3B, the method M then proceeds to block S22 where portions of the top electrode layer, the ferroelectric layer, the bottom electrode layer, and the first dielectric layer are removed until the inter-metal dielectric layer is exposed through the second patterned mask. With reference to FIGS. 14A-14C, one or more etching processes are performed to remove portions of the top electrode layer 156 and the ferroelectric layer 138 of the memory region 102A (See FIGS. 14B and 14C), the top electrode layer 156 and the ferroelectric layer 138 of the logic region 102B (See FIG. 14A). In some embodiments, the etching process is performed to remove an entirety of the top electrode layer 156 and the ferroelectric layer 138 of the logic region 102B.

Figure 15:
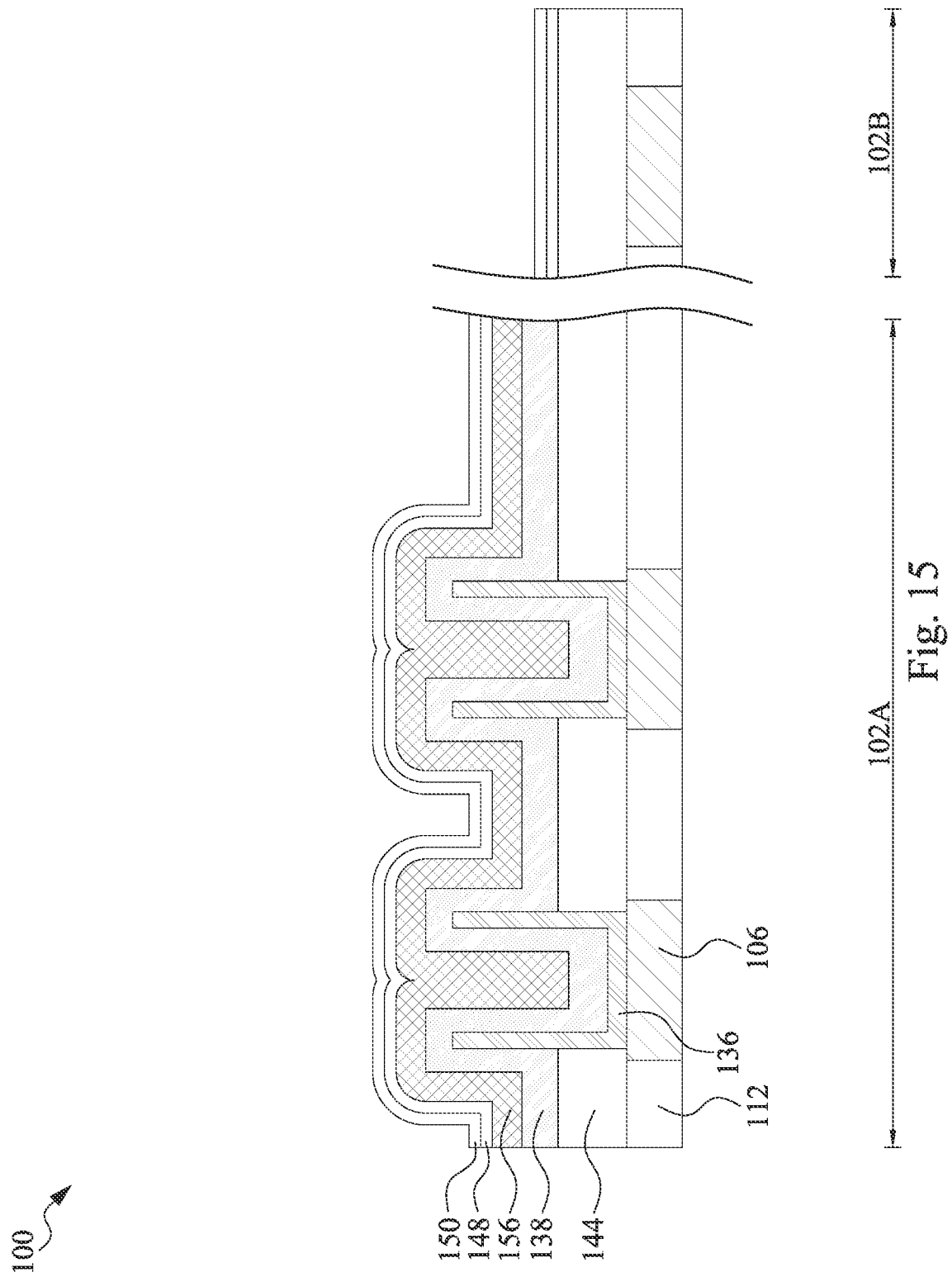

Returning to FIG. 3B, the method M then proceeds to block S23 where an etch stop layer and a protective liner layer are conformally formed over the top electrode layer. With reference to FIG. 15, an etch stop layer 148 is conformally formed over the top electrode layer 156. In some embodiments, the etch stop layer 148 may include SiCN, SiCO, SiO₂, SiN, SiC and AlON, combinations thereof, or other suitable materials. In FIG. 2B, a protective liner layer 150 is conformally formed over the etch stop layer 148. In some embodiments, the protective liner layer 150 may include a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, a material of the etch stop layer 148 is different from a material of the protective liner layer 150 and then an interface exists therebetween.

Figure 16:
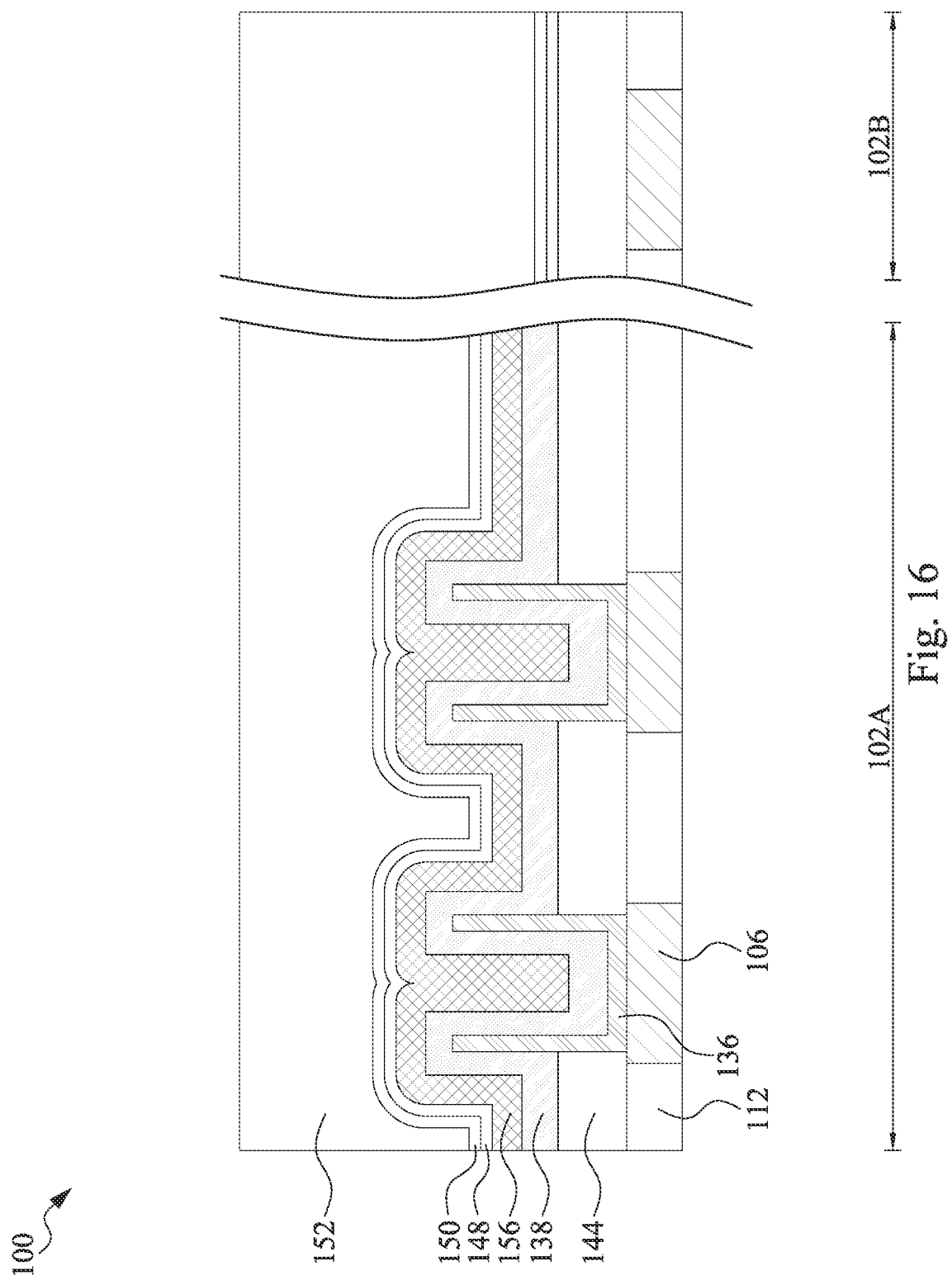

Returning to FIG. 3B, the method M then proceeds to block S24 where a second dielectric layer is formed over the protective liner. With reference to FIG. 16, the IMD layer 152 is formed over the protective liner layer 150 and fills a gap between two neighboring memory cells 134 as shown in FIG. 1B. In some embodiments, the upper IMD layer 152 may be formed using chemical vapor deposition (CVD) such as LPCVD, PECVD, and FCVD. In some embodiments, the top surface of the IMD layer 152 is planarized. In FIG. 2B, the IMD layer 152 may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HS Q), porous methyl silsesquioxane (MSQ), porous polyarylether (PAE), porous SiLK, or porous silicon oxide (SiO₂) In some embodiment, the dielectric layer 112 may include SiCN, SiCO, SiO₂, SiN, SiC and AlON, combinations thereof, or other suitable materials. In some embodiment, a dielectric constant (k) of the dielectric layer 112 is less than about 2.5. In some embodiments, a material of the IMD layer 152 may be different form a material of the protective liner layer 150.

Figure 17:
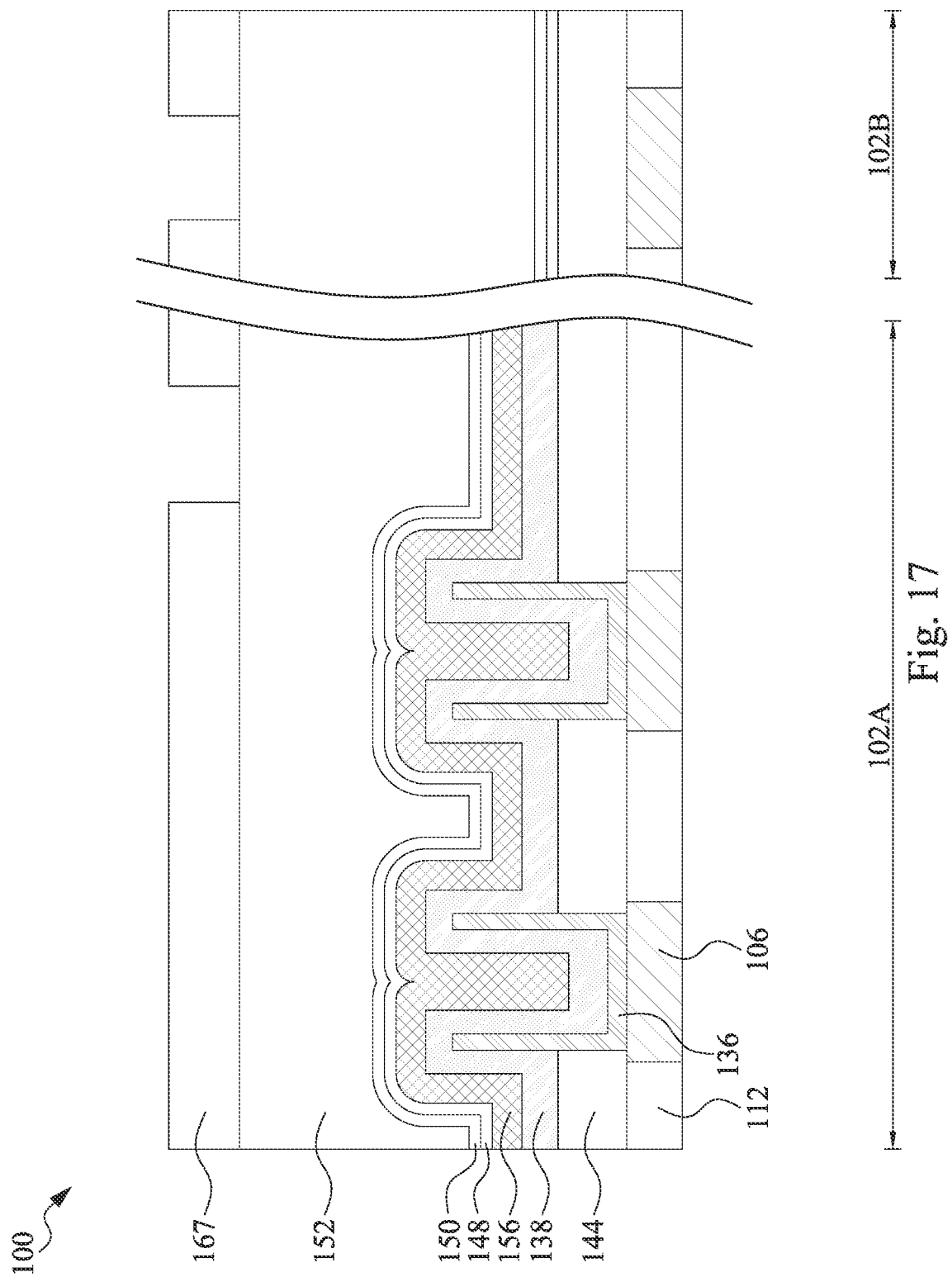

Returning to FIG. 3B, the method M then proceeds to block S25 where a third patterned mask is formed over the second dielectric layer. With reference to FIG. 17, where a patterned mask layer 167 is formed over the IMD layer 152. The patterned mask layer 167 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 18:
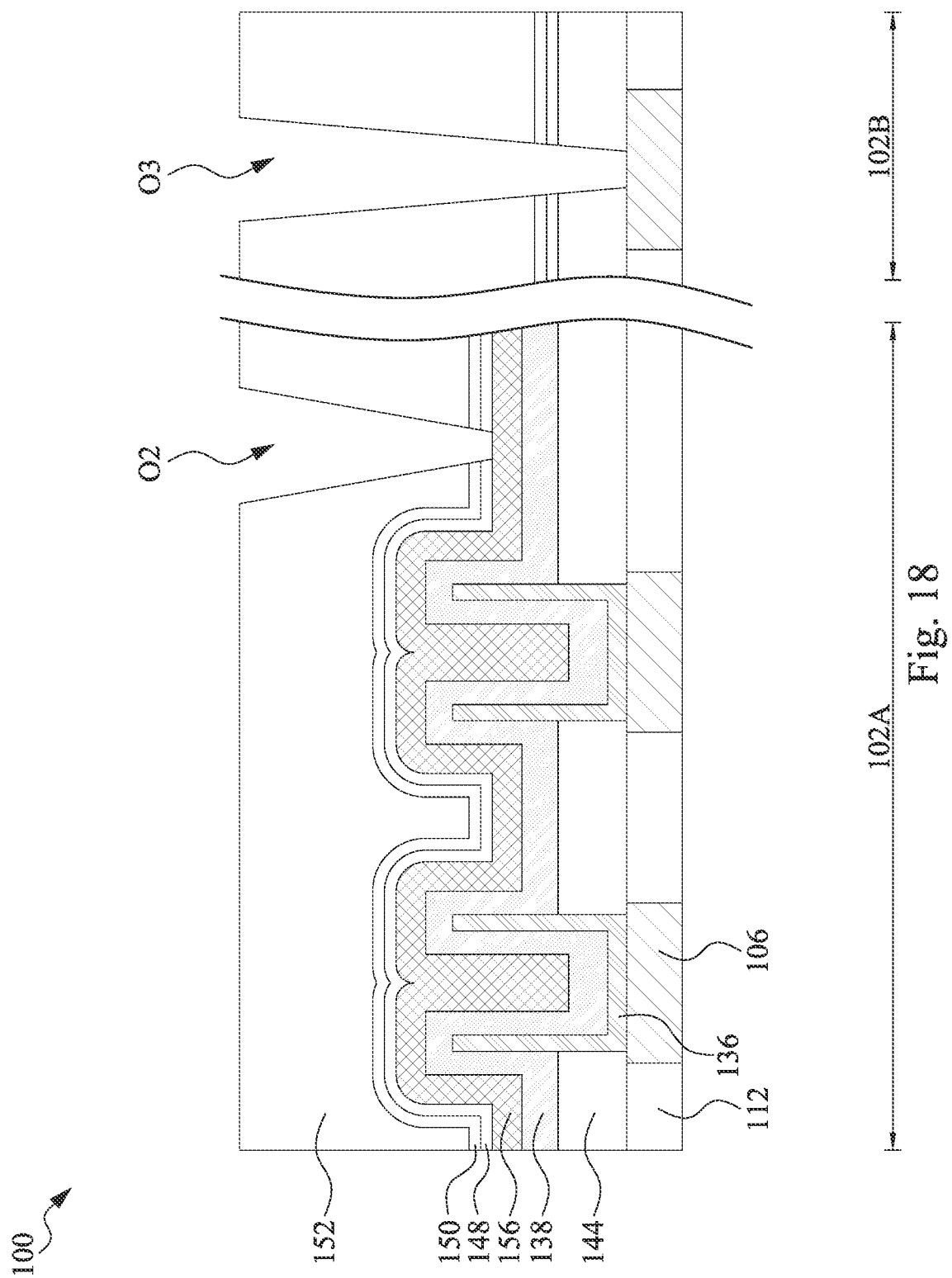

Returning to FIG. 3B, the method M then proceeds to block S26 where portions of the second dielectric layer, the protective liner, and the etch stop layer are moved until the top electrode layer is exposed through the third patterned mask to form a via hole. With reference to FIG. 18, one or more etching processes are performed to form an opening O3 above the bottom conductive line 106 of the logic region 102B and an opening O2 above the top electrode layer 156 of the memory region 102A. The Opening O2 of the memory region 102A does not overlap the bottom conductive line 106. The etching process is performed using the patterned mask 167 as an etching mask.

Figure 19:
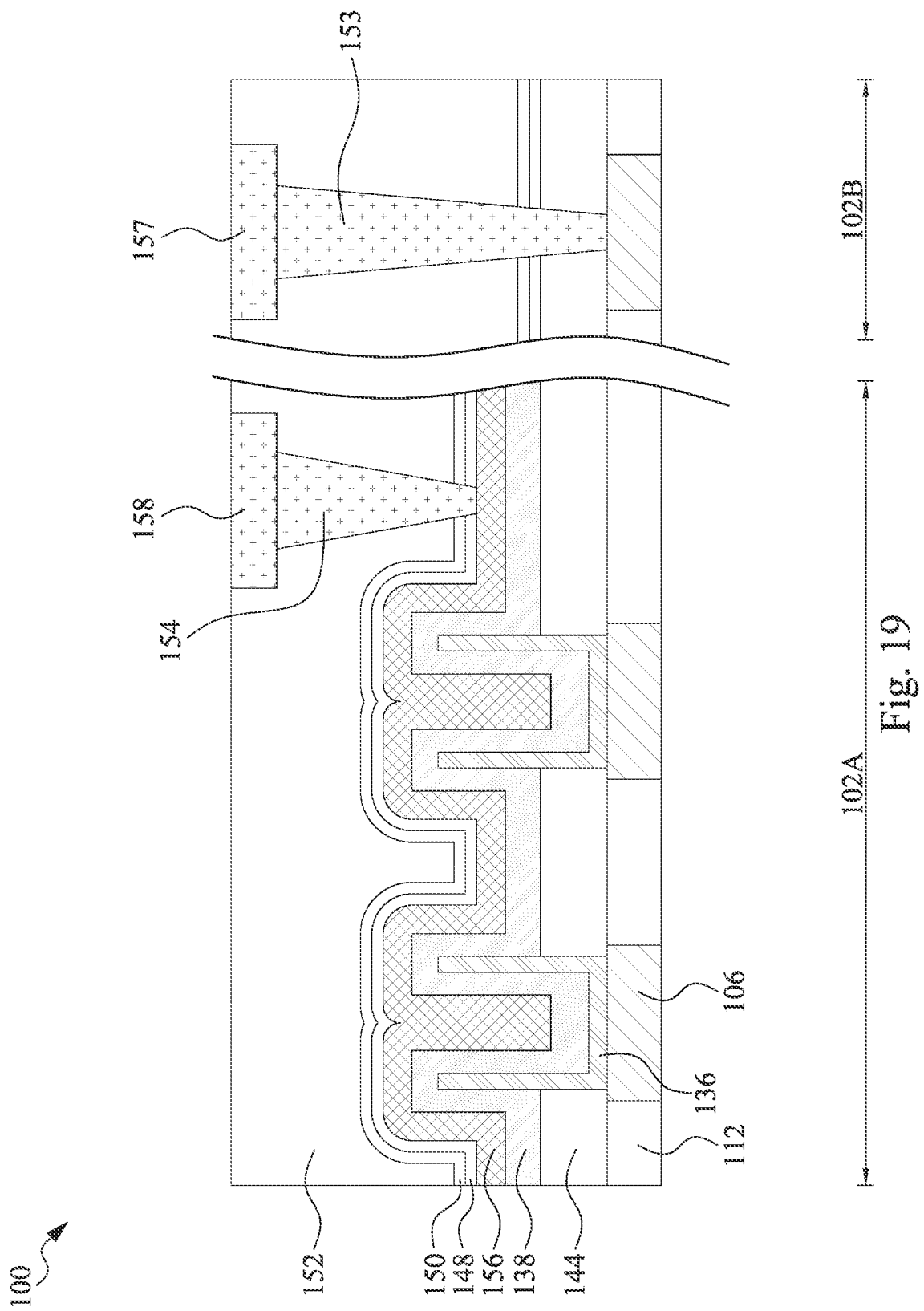

Returning to FIG. 3B, the method M then proceeds to block S27 where a top electrode via in the via hole is formed to land on the top electrode layer. With reference to FIG. 19, a metal material (e.g., copper, aluminum, etc) is filled in the openings O2 and O3 by suitable processes such as plating, chemical vapor deposition (CVD), physical vapor deposition (PVD) and/or the like, and then removing the conductive material layer above the upper IMD layer 152 by suitable processes such as CMP, etching and/or the like to form the top electrode via 154 of the memory region 102A and the top electrode via 153 of the logic region 102B. Then, the conductive line 158 is formed above the top electrode via 154, and the conductive line 157 is formed above the top electrode via 153. In some embodiments, the top electrode vias 153 and 154 may include copper, Pt, Ru, aluminum, tantalum, tungsten, tantalum nitride (TaN), titanium, titanium nitride (TiN), combinations thereof, or other suitable materials. In some embodiments, the conductive lines 157 and 158 may include copper, Pt, Ru, aluminum, tantalum, tungsten, tantalum nitride (TaN), titanium, titanium nitride (TiN), combinations thereof, or other suitable materials.

Figure 20:
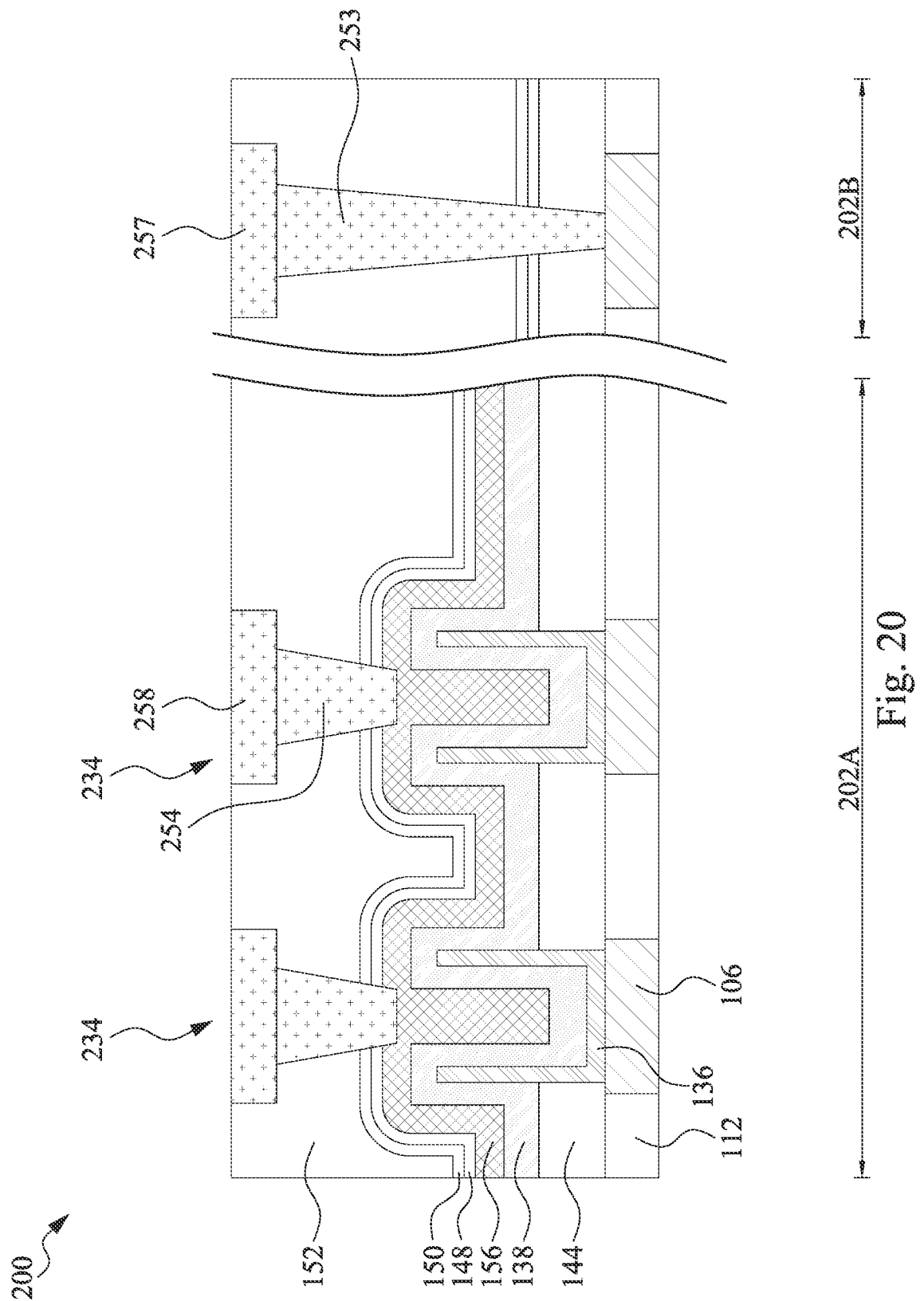
FIG. 20 is a cross-sectional view of an integrated circuit (IC) structure including a ferroelectric random access memory structure according to some embodiments of the present disclosure.

Reference is made to FIG. 20. FIG. 20 is a cross-sectional view of an integrated circuit (IC) structure including a ferroelectric random access memory structure according to some embodiments of the present disclosure. It should be pointed out that operations for forming an integrated circuit (IC) structure 200 are substantially the same as the operations for forming the IC structure 100 shown in FIGS. 4-19, and reference may be made to the foregoing paragraphs for the related detailed descriptions and such descriptions are not provided again herein. The difference between the present embodiment and the embodiment in FIGS. 4-19 is that the top electrode via 154 shown in FIGS. 4-19 is removed and adds a top electrode via 254 to be in contact with the top electrode layer 156 of the memory cell 134. In FIG. 20, the top electrode via 254 penetrates the protective liner layer 150 and the etch stop layer 148 and overlaps the bottom conductive line 106.

Figure 21:
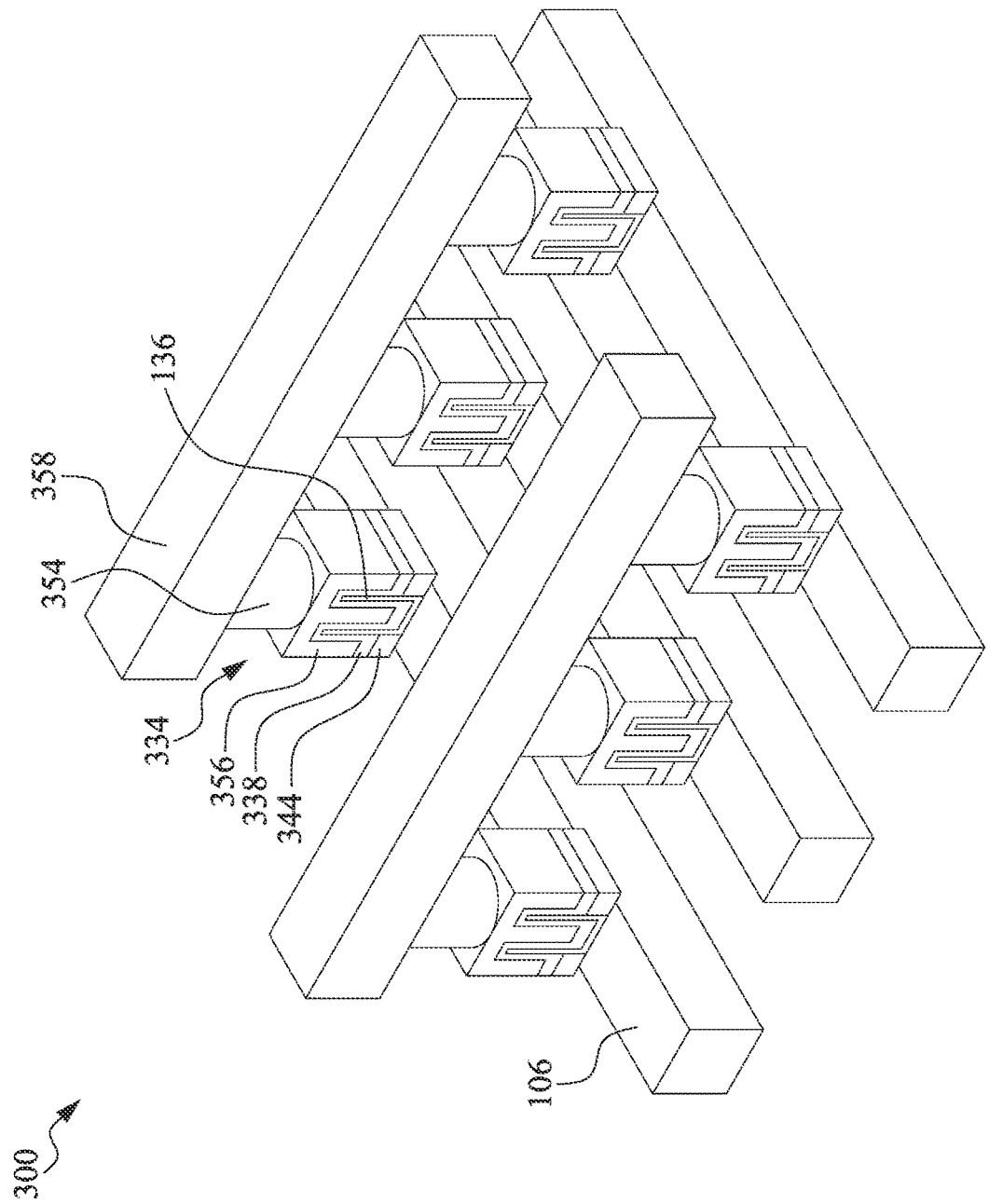
FIG. 21 is a perspective view of a ferroelectric random access memory (FRAM) cell according to some embodiments of the present disclosure.

Reference is made to FIG. 21. FIG. 21 is a perspective view of a ferroelectric random access memory (FRAM) cell according to some embodiments of the present disclosure. It should be pointed out that operations for forming an integrated circuit (IC) structure 300 are substantially the same as the operations for forming the IC structure 100 shown in FIGS. 4-19, and reference may be made to the foregoing paragraphs for the related detailed descriptions and such descriptions are not provided again herein. The difference between the present embodiment and the embodiment in FIGS. 4-19 is that memory cells 334 are separated. Hence, memory cells 334 on the different bottom conductive lines 106 are spaced apart from each other by the IMD layer 152 as shown in FIGS. 2B and 20. In FIG. 21, the memory cell 334 may include a bottom electrode layer 136 and a top electrode layer 356, with a ferroelectric layer 338 sandwiched in between the bottom and top electrode layers 136 and 356. A conductive line 358 is across the bottom conductive lines 106, is connected to the memory cells 334 through top electrode vias 354, and overlaps the memory cells 334. Dielectric layers 144 of the memory cell 334 are spaced apart from each other.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that an effective area between the top electrode layer and the ferroelectric layer and/or between the bottom electrode layer and the ferroelectric layer of the memory cell is greater than a projection area of the memory cell on the bottom conductive line, such that an effective area of capacitor and reliability may be improved. In addition, the top electrode via (TEVA) may land on a periphery of cell line and non-overlaps the memory cell, such that the TEVA may not align the memory cell so as to improve the process window.

In some embodiments, a semiconductor device includes an inter-metal dielectric layer, a first conductive line, and a first ferroelectric random access memory (FRAM) structure. The first conductive line is embedded in the inter-metal dielectric layer and extends along a first direction. The first FRAM structure is over inter-metal dielectric layer and includes a bottom electrode layer, a ferroelectric layer, and a top electrode layer. The bottom electrode layer is over the first conductive line and has an U-shaped when viewed in a cross section taken along a second direction substantially perpendicular to the first direction. The ferroelectric layer is conformally formed on the bottom electrode. The top electrode layer is over the ferroelectric layer.

In some embodiments, a semiconductor device includes an inter-metal dielectric layer, a first conductive line, a bottom electrode layer, a ferroelectric layer, and a top electrode layer. The first conductive line is embedded in the inter-metal dielectric layer. The bottom electrode layer is over the first conductive line. The ferroelectric layer extends along a first sidewall and a top surface of the bottom electrode layer. The top electrode layer is over the ferroelectric layer.

In some embodiments, a method of forming a semiconductor device includes forming an inter-metal dielectric layer over a substrate; forming a conductive line embedded in the inter-metal dielectric layer; forming a dielectric structure over the inter-metal dielectric layer and the conductive line; etching the dielectric structure until the conductive line is exposed; forming a bottom electrode layer to land on the exposed conductive line such that the bottom electrode layer has an U-shaped when viewed in a cross section; forming a ferroelectric layer over the bottom electrode layer; and forming a top electrode layer over the ferroelectric layer.

In some embodiments, a method of forming a semiconductor device includes forming an inter-metal dielectric layer over a substrate; forming a first conductive line embedded in the inter-metal dielectric layer; forming a dielectric structure over the inter-metal dielectric layer and the first conductive line; etching the dielectric structure until the first conductive line is exposed; forming a bottom electrode layer on the exposed first conductive line such that the bottom electrode layer has an U-shaped when viewed in a cross section; forming a ferroelectric layer over the bottom electrode layer; forming a top electrode layer over the ferroelectric layer. In some embodiments, forming the dielectric structure over the inter-metal dielectric layer and the first conductive line includes: depositing a first dielectric layer of the dielectric structure over the inter-metal dielectric layer and the first conductive line; and depositing a second dielectric layer of the dielectric structure over the first dielectric layer and having a different material than the first dielectric layer. In some embodiments, the first dielectric layer is made of a carbon-containing material, and the second dielectric layer is made of an oxide material. In some embodiments, forming the bottom electrode layer includes: conformally depositing a bottom electrode material on the etched dielectric structure; and performing a planarizing process on the bottom electrode material until the dielectric structure is exposed. In some embodiments, forming the bottom electrode layer includes: after performing the planarizing process, removing a portion of the dielectric structure, such that a top surface of the bottom electrode layer is higher than a top surface of the dielectric structure. In some embodiments, the bottom electrode layer has a protrusion extending above the dielectric structure and terminating prior to overlapping the dielectric structure. In some embodiments, the ferroelectric layer formed on the dielectric structure is in a position lower than a top end of a first vertical portion of the bottom electrode layer. In some embodiments, after forming the ferroelectric layer over the bottom electrode layer, the ferroelectric layer wraps around three sides of a first protrusion of the bottom electrode layer when viewed in the cross section. In some embodiments, after forming the ferroelectric layer over the bottom electrode layer, the ferroelectric layer further wraps around three sides of a second protrusion of the bottom electrode layer when viewed in the cross section. In some embodiments, the method further includes: forming a second conductive line embedded in the inter-metal dielectric layer, wherein after forming the ferroelectric layer over the bottom electrode layer, the ferroelectric layer further extends across the second conductive line.

In some embodiments, a method of forming a semiconductor device includes depositing a first dielectric layer over a conductive line in an inter-metal dielectric layer over a substrate; depositing a second dielectric layer over the first dielectric layer; etching the first and second dielectric layers to form an opening exposing the conductive line; conformally depositing a bottom electrode layer over the etched first and second dielectric layers and in the opening; performing a planarizing process on the bottom electrode layer until the second dielectric layer is exposed; removing the second dielectric layer; forming a ferroelectric layer over the bottom electrode layer; forming a top electrode layer over the ferroelectric layer. In some embodiments, the second dielectric layer is made of a different material than the first dielectric layer. In some embodiments, the first dielectric layer includes SiC, and the second dielectric layer includes silicon oxide. In some embodiments, removing the second dielectric layer is performed by an etching process that etches the second dielectric layer at a faster etch rate than it etches the bottom electrode layer. In some embodiments, after removing the second dielectric layer, the bottom electrode layer has a U-shaped cross section.

In some embodiments, a method of forming a semiconductor device includes forming a first conductive line in a first dielectric layer over a substrate; forming a second dielectric layer over the first dielectric layer and the first conductive line; forming a bottom electrode layer partially embedded in the second dielectric layer and having a vertical portion extending upwardly from the first conductive line to beyond a top surface of the second dielectric layer; conformally forming a ferroelectric layer on the bottom electrode layer and the second dielectric layer, the ferroelectric layer formed on the second dielectric layer being in a position lower than a top end of the vertical portion of the bottom electrode layer; conformally forming a top electrode layer on the ferroelectric layer. In some embodiments, the bottom electrode layer has an U-shaped when viewed in a cross section taken along a lengthwise direction of the first conductive line. In some embodiments, the bottom electrode layer has a narrower width than the first conductive line when viewed in a cross section taken along a direction perpendicular to a lengthwise direction of the first conductive line. In some embodiments, the method further includes: forming a second conductive line in the first dielectric layer and in parallel with the first conductive line, wherein the top electrode layer extends across the second conductive line. In some embodiments, the method further includes: forming a second conductive line in the first dielectric layer and in parallel with the first conductive line, wherein the ferroelectric layer extends across the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a random access memory (RAM) structure over a substrate, the RAM structure comprising:
  a bottom electrode layer;
  a ferroelectric layer over the bottom electrode layer; and
  a top electrode layer over the ferroelectric layer; and
  wherein from the cross-sectional view,
   a top surface of the top electrode has a recessed region, and
   a bottom of the recessed region is in a position higher than a top surface of the ferroelectric layer and a top surface of the bottom electrode;
 a dielectric layer over the substrate and laterally surrounding a lower portion of the RAM structure, wherein from a cross-sectional view, the bottom electrode layer of the RAM structure has a lateral portion and a first vertical portion, and the first vertical portion upwardly extends from the lateral portion to a position higher than a top surface of the dielectric layer, and the bottom electrode layer of the RAM structure non-overlaps the dielectric layer,
 the ferroelectric layer wraps around three sides of the first vertical portion of the bottom electrode layer.

2. The semiconductor device of claim 1, wherein a top end of the first vertical portion of the bottom electrode layer is in a higher position than the ferroelectric layer above the dielectric layer.

3. The semiconductor device of claim 1, wherein the top electrode layer wraps around three sides of the first vertical portion of the bottom electrode layer.

4. The semiconductor device of claim 1, wherein a top end of the first vertical portion of the bottom electrode layer is in a higher position than the top electrode layer above the dielectric layer.

5. The semiconductor device of claim 1, wherein the bottom electrode layer further comprises a second vertical portion upwardly extending from the lateral portion of the bottom electrode layer to a position higher than the top surface of the dielectric layer.

6. The semiconductor device of claim 1, further comprising:
 a first conductive line over the substrate, wherein the RAM structure is over the first conductive line, and the ferroelectric layer of the RAM structure extends along a direction perpendicular to a lengthwise direction of the first conductive line and across the first conductive line.

7. The semiconductor device of claim 6, further comprising:
 a second conductive line over the substrate and extending in parallel with the first conductive line, wherein the ferroelectric layer further extends across the second conductive line.

8. The semiconductor device of claim 6, wherein the bottom electrode layer has a narrower width than the first conductive line when viewed in a cross section taken along the direction perpendicular to the lengthwise direction of the first conductive line.

9. The semiconductor device of claim 1, wherein the dielectric layer comprises SiC.

10. The semiconductor device of claim 1, wherein from the cross-sectional view, the bottom electrode layer has a U-shaped profile.

11. A semiconductor device, comprising:
 a conductive line over a substrate;
 a bottom electrode over the conductive line, wherein from a cross-sectional view, the bottom electrode has a U-shaped profile;
 a ferroelectric layer over the bottom electrode and extending across the conductive line, wherein the ferroelectric layer is conformal to the bottom electrode;
 a top electrode over the ferroelectric layer, wherein from the cross-sectional view, a top surface of the top electrode has a recessed region, and a bottom of the recessed region is in a position higher than a top surface of the ferroelectric layer and a top surface of the bottom electrode; and
 a dielectric layer over the substrate and laterally surrounding a lower portion of the bottom electrode, wherein the bottom of the recessed region is in the position higher than a bottom surface of the dielectric layer, and a top end of a vertical portion of the bottom electrode is in a position higher than a top surface of the ferroelectric layer formed on the dielectric layer.

12. The semiconductor device of claim 11, wherein the recessed region of the top electrode overlaps with the bottom electrode.

13. The semiconductor device of claim 11, wherein the recessed region of the top electrode overlaps with the conductive line.

14. The semiconductor device of claim 11, wherein the recessed region of the top electrode non-overlaps with the dielectric layer.

15. The semiconductor device of claim 11, wherein from the cross-sectional view, the bottom electrode has a lateral portion and a vertical portion, and the vertical portion upwardly extends from the lateral portion to a position higher than a top surface of the dielectric layer.

16. The semiconductor device of claim 15, wherein the ferroelectric layer wraps around three sides of the vertical portion of the bottom electrode.

17. A method of forming a semiconductor device, comprising:
 forming a dielectric structure over conductive lines, wherein the conductive lines are in parallel with each other;
 etching the dielectric structure to form openings exposing the conductive lines;

conformally depositing a bottom electrode layer over the dielectric structure and in the openings;

removing portions of the bottom electrode layer above the dielectric structure, such that bottom electrodes are formed above the conductive lines and separated from each other;

removing an upper layer of the dielectric structure while leaving a lower layer of the dielectric structure over the conductive lines;

forming a ferroelectric layer over the bottom electrodes; and forming a top electrode layer over the ferroelectric layer.

18. The method of claim 17, wherein the upper layer of the dielectric structure is made of a different material than the lower layer of the dielectric structure.

19. The method of claim 17, wherein the step of removing the upper layer of the dielectric structure is performed by an etching process that etches the upper layer of the dielectric structure at a faster etch rate than it etches the bottom electrodes.

20. The method of claim 17, wherein the bottom electrodes have U-shaped cross section profiles taken along a direction perpendicular to lengthwise directions of the conductive lines.

* * * * *